(12) United States Patent
Zur

(10) Patent No.: US 6,900,442 B2
(45) Date of Patent: May 31, 2005

(54) HYBRID DETECTOR FOR X-RAY IMAGING

(75) Inventor: Albert Zur, Ganei Tikva (IL)

(73) Assignee: Edge Medical Devices Ltd., North Industrial Zone (IL)

( * ) Notice: Subject to any disclaimer, the term of this patent is extended or adjusted under 35 U.S.C. 154(b) by 480 days.

(21) Appl. No.: 09/989,319

(22) Filed: Nov. 20, 2001

(65) Prior Publication Data

US 2002/0079458 A1 Jun. 27, 2002

Related U.S. Application Data

(63) Continuation-in-part of application No. 09/806,187, filed as application No. PCT/IL99/00409 on Jul. 26, 1999.

(51) Int. Cl.$^7$ ................................................ G01T 1/24
(52) U.S. Cl. ............................ 250/370.11; 250/370.09
(58) Field of Search ....................... 250/370.11, 370.01, 250/370.08, 370.09, 239, 370.14, 580, 208.1, 227.11; 359/566

(56) References Cited

U.S. PATENT DOCUMENTS

| | | | |
|---|---|---|---|
| 4,176,275 A | 11/1979 | Korn et al. ................. 250/213 |
| 4,268,750 A | 5/1981 | Cowart ..................... 250/315.1 |
| 4,457,010 A | 6/1984 | Jenkins et al. .............. 378/167 |
| 4,663,774 A | 5/1987 | Saffer | |
| 4,951,305 A | 8/1990 | Moore et al. ............... 378/147 |
| 5,008,920 A | 4/1991 | Gralak ........................ 378/185 |
| 5,084,911 A | 1/1992 | Sezan et al. ................... 378/96 |
| 5,276,333 A | 1/1994 | Robertson ................ 250/484.4 |
| 5,313,066 A | * 5/1994 | Lee et al. .............. 250/370.09 |
| 5,317,407 A | 5/1994 | Michon ....................... 348/306 |
| 5,440,130 A | 8/1995 | Cox et al. .............. 250/370.09 |
| 5,508,507 A | 4/1996 | Nelson et al. .............. 250/214 |
| 5,510,626 A | 4/1996 | Nelson et al. .............. 250/591 |
| 5,532,475 A | 7/1996 | Tonami et al. .............. 250/214 |
| 5,608,775 A | 3/1997 | Hassler et al. ............. 378/98.8 |
| 5,627,377 A | * 5/1997 | Hamilton et al. ...... 250/370.13 |
| 5,648,660 A | 7/1997 | Lee et al. .............. 250/370.09 |
| 5,652,430 A | 7/1997 | Lee ....................... 250/370.09 |
| 5,666,395 A | 9/1997 | Tsukamoto et al. ........ 378/98.4 |

(Continued)

FOREIGN PATENT DOCUMENTS

| | | |
|---|---|---|
| EP | 0 574 690 | 12/1993 |
| JP | 61096867 | 5/1986 |
| JP | 2000 139887 | 5/2000 |
| WO | WO 01/08224 | 2/2001 |

OTHER PUBLICATIONS

Patent Abstracts of Japan vol. 010, No. 275, May 15, 1986 & JP 61 096867.
U.S. patent application No.: 09/233, 327, filed Jan. 20, 1999, entitled: "X–Ray Imaging System".
U.S. patent application No.: 09/233, 320, filed Jan. 20, 1999, entitled: "X–Ray Imaging System".
U.S. patent application No.: 09/292, 316, filed Apr. 15, 1999, entitled: "X–Ray Imaging System".
Patent Abstracts of Japan vol. 2000, No. 8, Oct. 6, 2000 & JP 2000 139887.

*Primary Examiner*—Constantine Hannaher
*Assistant Examiner*—Otilia Gabor
(74) *Attorney, Agent, or Firm*—Ladas & Parry

(57) ABSTRACT

Ionizing radiation imaging apparatus and method including a scintillator element which emits optical radiation as a result of absorption of ionizing radiation, and a photoconductive multilayer element optically coupled to the scintillator element, the photoconductive multilayer element including a charge generation layer which is sensitive to the optical radiation emitted by the scintillator element, and a charge transport layer disposed over the charge generation layer, the charge transport layer being operative to retain a charge pattern corresponding to the ionizing radiation.

33 Claims, 14 Drawing Sheets

U.S. PATENT DOCUMENTS

| | | |
|---|---|---|
| 5,668,375 A | 9/1997 | Petrick et al. ......... 250/370.09 |
| 5,677,539 A | 10/1997 | Apotovsky et al. .... 250/370.13 |
| 5,751,783 A | 5/1998 | Granfors et al. ............ 378/108 |
| 5,801,385 A | 9/1998 | Endo et al. ............ 250/370.11 |
| 5,809,107 A | 9/1998 | Schmitt |
| 6,043,495 A * | 3/2000 | Verger et al. ........... 250/370.01 |
| 6,244,507 B1 | 6/2001 | Garland et al. ............. 235/383 |
| 6,310,351 B1 | 10/2001 | Zur ....................... 250/370.09 |
| 6,434,218 B1 * | 8/2002 | Matsumoto ................. 378/155 |
| 2002/0090055 A1 | 7/2002 | Zur et al. |

* cited by examiner

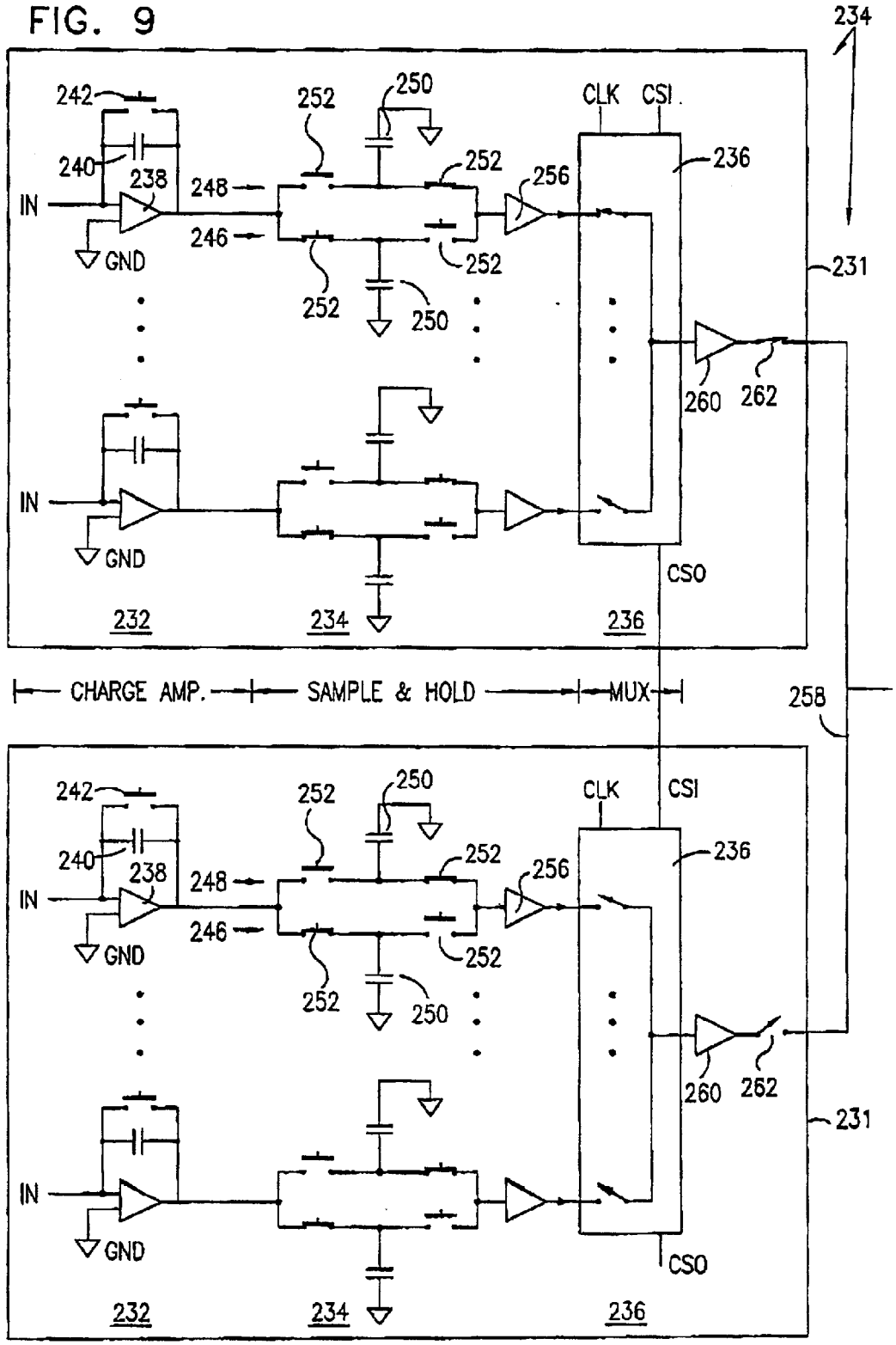

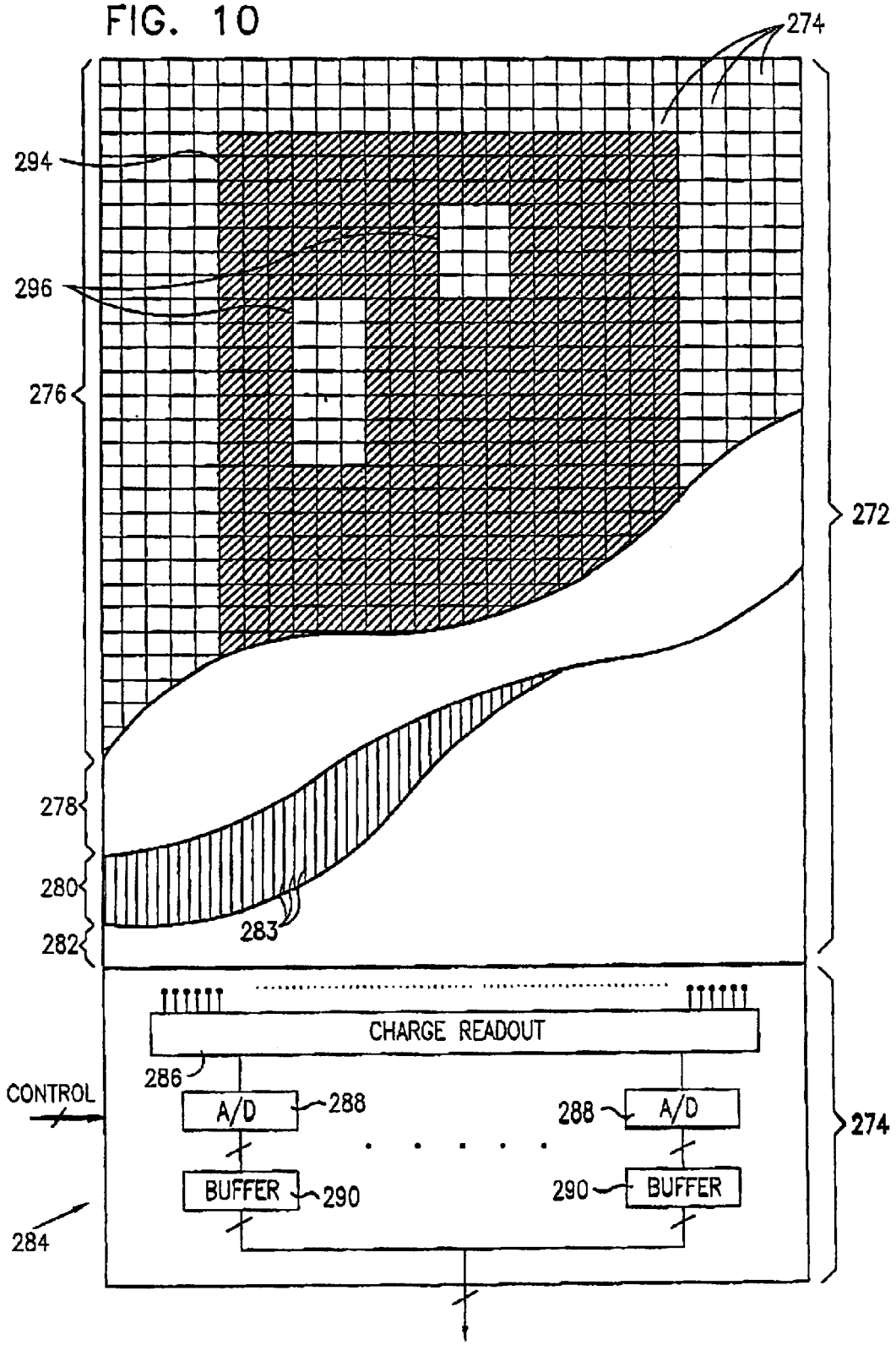

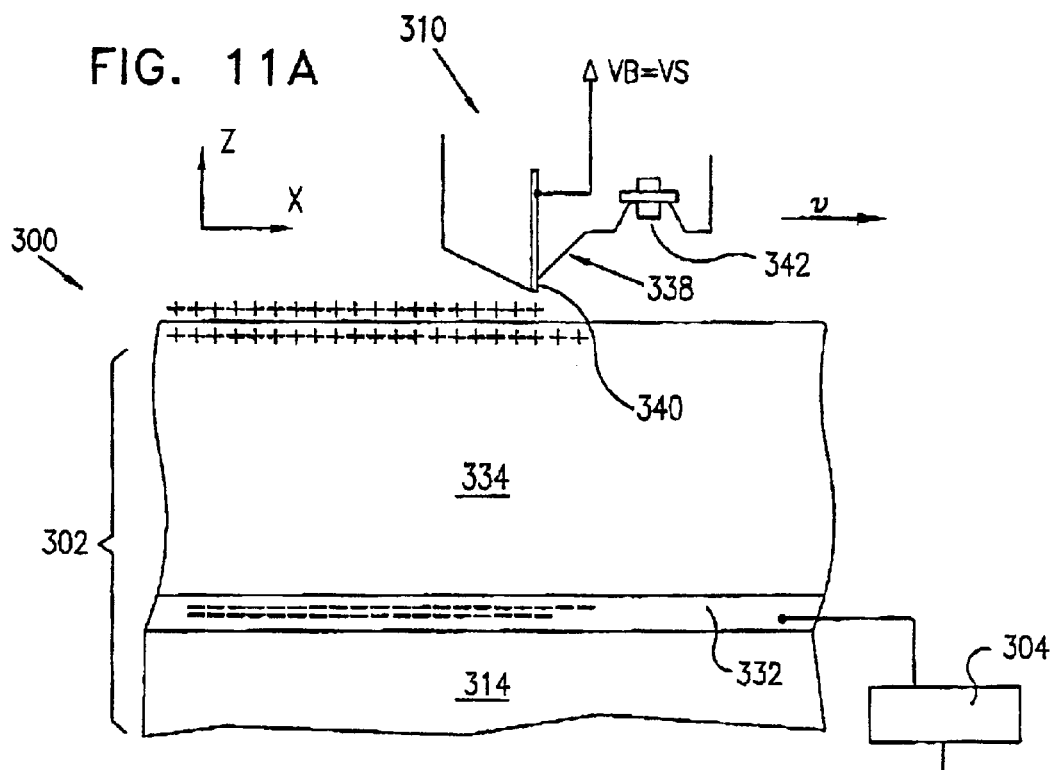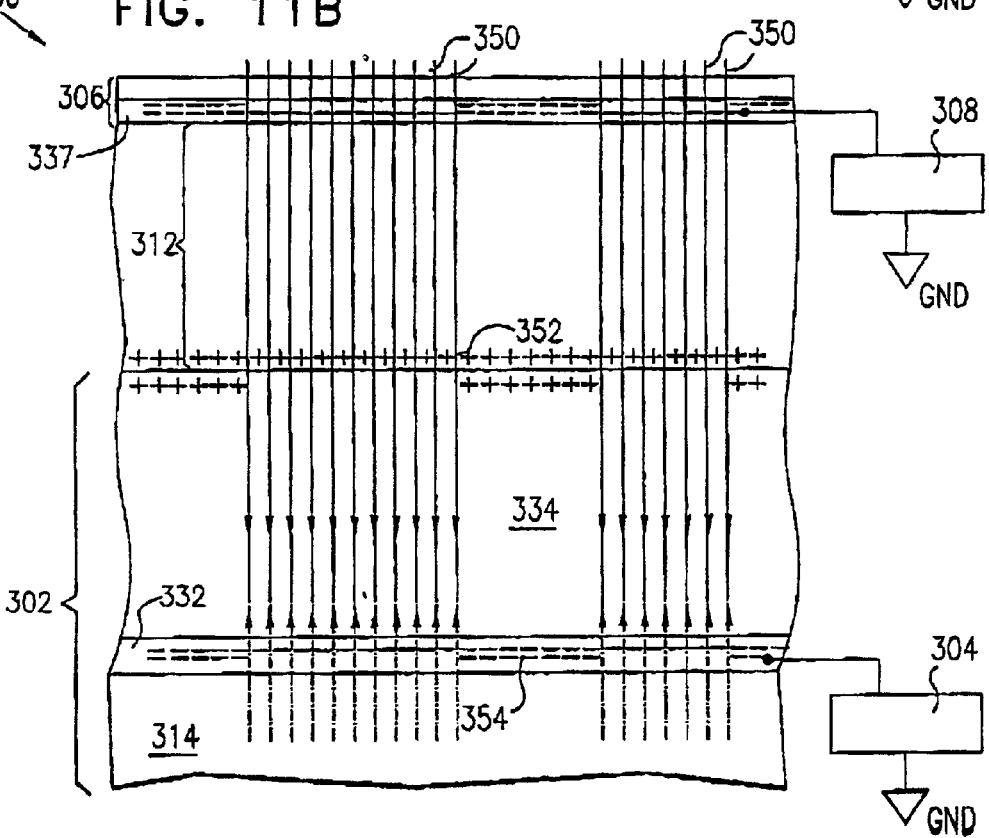

HYBRID DETECTOR FOR X-RAY IMAGING

REFERENCE TO CO-PENDING APPLICATIONS

This application is a continuation-in-part of U.S. patent application Ser. No. 09/806,187, which is a national phase application of PCT/IL99/00409 Jul. 26, 1999, filed on Jul. 16, 2001.

FILED OF THE INVENTION

The present invention relates to systems and methods in the field of ionizing radiation imaging and more particularly to a system and method for digital detection of X-ray images.

BACKGROUND OF THE INVENTION

There are described in the patent literature numerous systems and methods for the recording of X-ray images. Conventional X-ray imaging systems use an X-ray sensitive phosphor screen and a photosensitive film to form visible analog representations of modulated X-ray patterns. The phosphor screen absorbs X-ray radiation and emits visible light. The visible light exposes the photosensitive film to form a latent image of the X-ray pattern. The film is then chemically processed to transform the latent image into a visible analog representation of the X-ray pattern.

Recently, there have been proposed systems and methods for detection of static and or dynamic X-ray images. These digital X-ray systems and methods provide digital representations of X-ray images in which the X-ray image is recorded as readable electrical signals, thus obviating the need for films and screen in the imaging process. Digital X-ray systems typically rely on direct conversion of X-rays to charge carriers or alternatively indirect conversion in which X-rays are converted to light which is then converted to charge carriers.

Direct conversion approaches typically use an X-ray sensitive photoconductor such as amorphous selenium overlying a solid state element which comprises a solid state array having thin-film-transistors (TFT) or diodes coupled to an array of storage capacitors. An example of a direct conversion approach is provided by U.S. Pat. No. 5,313,066 to Lee et al., which describes an X-ray image capturing element comprising a panel having a layered structure including a conductive layer comprising a plurality of discrete accessible microplates and a plurality of access electrodes and electronic components built on the panel.

A further example of a direct conversion approach is U.S. Pat. No. 5,652,430 to Lee which describes a radiation detection panel made up of an assembly of radiation detector sensors arrayed in rows and columns where each sensor includes a radiation detector connected to a charge storage capacitor and a diode.

Indirect conversion approaches typically use a scintillating material such as columnar cesium iodide overlying a solid state active matrix array comprising photodiodes. The X-rays are converted to light by the scintillating material and the light is converted to charge by the photodiodes. An example of an indirect approach is provided by U.S. Pat. No. 5,668,375 to Petrick et al. which describes a large solid state X-ray detector having a plurality of cells arranged in rows and columns composed of photodiodes.

A further example of an indirect approach is provided by U.S. Pat. No. 5,801,385 to Endo et. al. which describes an X-ray image detector having a plurality of photoelectric conversion elements on an insulating substrate.

A further example of an indirect approach is provided by U.S. Pat. No. 5,532,475 to Tonami et al. which describes a two-dimensional radiation detecting method and apparatus for converting incident radiation into electrical signals using a target structure and an electron beam scanner.

Direct and indirect conversion based digital X-ray detectors use charge storage matrices to retain imaging information, which is then electronically addressed, with stored charge read out taking place subsequent to exposure. In dynamic imaging such as fluoroscopy, "real-time" images are simulated by repeatedly reading the integrated radiation values of the storage matrix to provide a sufficiently high number of frames per second, e.g. 30 frames per second. Image information, which is retained in the charge storage matrix, is not available until after the end of the X-ray pulse, since the detectors are operated in a storage mode. Thus, measurements made from the current generation of digital detectors are not real-time.

For medical diagnosis, it is desirable to use the minimum X-ray exposure dose that will provide an image having acceptable contrast and brightness. Various X-ray examinations, when performed on patients with a variety of body types, may require varied doses to provide an image suitable for diagnostics. Thus, the dynamic range of a system suitable for all types of examinations may be as high as $10^4:1$.

The actual X-ray exposure dose for a specific X-ray examination may be selected using predetermined imaging exposure parameters and patient characteristics loaded from periodically updated lookup tables into a X-ray system console. Alternatively, the actual dose may be adjusted automatically using automatic exposure control devices, typically placed in front of the X-ray detector, to provide real-time control feedback to an X-ray source.

Automatic exposure control devices, which must operate in real-time, typically make use of a multi-chamber ion chamber or a segmented phototimer as described in U.S. Pat. No. 5,084,911. These devices sense radiation passing therethrough and provide a signal which terminates the X-ray exposure when a predetermined dose value, yielding a desired radiation density level, has been reached.

Prior to exposure, the chamber or chambers to be used are selected by the X-ray technologist, and the patient or X-ray detector is aligned therewith. Disadvantages of conventional exposure control devices include the fact that the realtime exposure signals are averaged over a fixed chamber area and do not directly correspond to the image information in a region of interest; the fact that devices located in front of the detector cause non-uniform attenuation of the X-rays and cause some of the radiation that would otherwise contribute to the signal at the detector to be lost; the fact that the devices are typically bulky and require external power sources; and the fact that the spectral sensitivity of the devices differs from that of the radiation image detector being used thus requiring corrections and calibrations for different X-ray tube voltage (kVp) values.

Efforts have been made to incorporate real-time exposure control into digital X-ray detectors, particularly those detectors based on the "indirect" conversion approach.

An example of apparatus for use in detecting real-time exposure information for an "indirect" scintillator based digital detector is described in U.S. Pat. No. 5,751,783 to Granfors et. al. This patent describes an exposure detection array of photodiodes positioned behind an imaging array of photodiodes. The exposure detection array, which is a separate component involving separate electronics, is used to detect light which passes through the imaging array in certain regions due to gaps between adjacent pixels caused by a relatively low pixel fill factor. Pixels are regionally grouped to provide regional density measurements.

Alternatively, for digital X-ray imaging, special methods have been proposed allowing digital detectors to sample the exposure prior to the imaging exposure using a two step method, thus simulating real-time exposure information. An example of a two-step exposure method is described in U.S. Pat. No. 5,608,775 to Hassler et al In that method exposure information for a digital detector is generated by first exposing the detector to a "calibrating" pulse in which an X-ray exposure of short duration produces an exposure in a solid state detector, which is then processed to calculate the X-ray transparency of the object being imaged in order to determine an optimum X-ray dose.

SUMMARY OF THE INVENTION

There is thus provided in accordance with a preferred embodiment of the present invention, an ionizing radiation imaging system for providing integrated radiation information based on a new hybrid digital X-ray detector suitable for ionizing radiation imaging, and in particular X-ray imaging for general radiography diagnostics.

There is thus provided in accordance with a preferred embodiment of the present invention a ionizing radiation imaging system having a scintillator element which emits optical radiation as a result of absorption of ionizing radiation; and a photoconductive multilayer element optically coupled to the scintillator element. The photoconductive multilayer element preferably includes a charge generation layer which is sensitive to the optical radiation emitted by the scintillator element, and a charge transport layer disposed over the charge generation layer. Preferably, the charge transport layer is operative to retain a charge pattern corresponding to the ionizing radiation image.

Further in accordance with a preferred embodiment of the present invention the ionizing radiation imaging system also includes a conductive layer, forming a plurality of elongate electrodes, disposed intermediate the scintillator element and the photoconductive multilayer element.

Still further in accordance with a preferred embodiment of the present invention, the ionizing radiation imaging system also includes an optically transparent blocking layer between the photoconductive multilayer element and the conductive layer. Preferably, the optically transparent blocking layer blocks charges of at least one polarity from being injected into the photoconductive multilayer element from the conductive layer.

Preferably, the charge transport layer is also operative to convert ionizing radiation to charge carriers.

In accordance with one preferred embodiment of the present invention, the photoconductive multilayer element also includes an optical radiation blocking layer overlying the charge transport layer.

The scintillator element of the ionizing radiation system may be formed on a generally optically reflecting substrate. Alternatively, the scintillator element may be formed on a generally optically absorbing substrate.

In accordance with one preferred embodiment of the present invention, the scintillator element includes a planarization layer.

In accordance with a preferred embodiment of the present invention, the scintillator element includes cesium iodide doped with thallium; the charge generation layer is formed of arsenic triselenide; and the charge transport layer is formed of amorphous selenium doped with either arsenic or chlorine or a combination thereof. Preferably, the optical radiation blocking layer is formed of amorphous alkali-doped selenium.

Alternatively, the charge generation layer may be formed of a selenium-tellerium-arsenic alloy.

Further in accordance with an alternative embodiment of the present invention, the charge transport layer is formed of an organic material.

Still further in accordance with a preferred embodiment of the present invention, the ionizing radiation sensitive system is sensitive to X-ray radiation.

There is also provided in accordance with another preferred embodiment of the present invention, an ionizing radiation imaging sensor which includes a first conversion element that is operative to convert imaging ionizing radiation to optical radiation; a second conversion element that is operative to convert optical radiation to a charge pattern corresponding to the imaging ionizing radiation; and a charge source operative at generally atmospheric pressure to provide non-contact charge injection onto the second conversion element thus causing said charge pattern to be sensed.

Preferably, the second conversion element of the ionizing radiation imaging sensor is further operative to directly convert ionizing radiation to electrical charges.

Further in accordance with a preferred embodiment of the present invention, the ionizing radiation detected by the ionizing radiation imaging sensor is X-ray radiation.

There is also proved in accordance with another preferred embodiment of the present invention, a ionizing radiation image sensor including a photoelectric conversion element with first and second opposing surfaces, wherein the photoelectric conversion element is highly photogeneration-sensitive to optical radiation impinging upon the first surface and relatively photogeneration-insensitive to optical radiation impinging upon the second surface; and an ionizing radiation sensitive scintillator element optically coupled to the first surface of said photoelectric conversion element.

Preferably, the second surface of the photoelectric conversion element is highly permeable to ionizing radiation.

Further in accordance with a preferred embodiment of the present invention, the second surface of the photoelectric conversion element is an exposed charge accepting and retaining surface.

Yet further in accordance with a preferred embodiment of the present invention, the photoelectric conversion element is amorphous selenium based.

There is also provided in accordance with another preferred embodiment of the present invention, a charge pattern produced in response to absorption of spatially modulated ionizing radiation. The charge pattern is preferably composed of charge carriers generated in response to partial absorption of the ionizing radiation and charge carriers generated in response to non-ionizing optical radiation emitted in response to further absorption of the ionizing radiation.

Preferably, the optical radiation is emitted concurrently with the absorption of the ionizing radiation.

Further in accordance with a preferred embodiment of the present invention, the optical radiation is emitted through external stimulation subsequent to the absorption of the ionizing radiation.

Preferably, the ionizing radiation is X-ray radiation.

There is also provided in accordance with another preferred embodiment of the present invention a method for sensing X-ray images and including the following steps: exposing a sensor to spatially modulated X-ray radiation; and forming a net charge pattern retained by the sensor. The net charge pattern preferably represents the spatially modulated radiation and is preferably composed of charge carriers generated in response to partial absorption of the spatially modulated X-ray radiation and charge carriers generated in response to optical radiation emitted within the sensor in response to further absorption of the spatially modulated X-ray radiation.

There is also provided in accordance with another preferred embodiment of the present invention a method for detecting X-ray images including the following steps: exposing an imaging sensor to ionizing radiation; emitting optical radiation in a scintillator element of the imaging sensor in response to absorption of the ionizing radiation; photogenerating charge in a charge generation layer of the imaging sensor in response to the optical radiation; providing transport of the photogenerated charge through a charge transport layer of the imaging sensor thereby creating a net charge pattern at the imaging sensor. Preferably, the net charge pattern generally corresponds to the ionizing radiation;

Further steps in accordance with the preferred embodiment of the present invention include the steps of injecting charge onto the sensor to uniformize the net charge pattern thus yielding measurable charge flow within the sensor; and detecting the measurable charge flow to provide a digital image representation of the X-ray images.

There is also provided in accordance with another preferred embodiment of the present invention, a method for detecting ionizing radiation images including the following steps: providing an imaging sensor; causing ionizing radiation to impinge on the imaging sensor; converting the ionizing radiation to optical radiation in the imaging sensor; converting the optical radiation to a charge pattern at the imaging sensor wherein the charge pattern corresponds to the ionizing radiation; and providing non-contact injection of charge at generally atmospheric pressure onto the imaging sensor, thus causing the charge pattern to be detected.

There is thus provided in accordance with a preferred embodiment of the present invention, a method for creating a charge pattern in an imaging sensor in response to ionizing radiation including the following steps: exposing the imaging sensor to ionizing radiation; emitting optical radiation in a scintillator element of the imaging sensor in response to absorption of the ionizing radiation; photogenerating charge in a charge generation layer of the imaging sensor in response to the optical radiation; and providing transport of the charge through a charge transport layer of the imaging sensor therefore creating a net charge pattern at the imaging sensor wherein the net charge pattern generally corresponds to the ionizing radiation.

There is thus provided in accordance with a preferred embodiment of the present invention, a method for detecting ionizing radiation images including the following steps: exposing the imaging sensor to ionizing radiation; emitting optical radiation in a scintillator element of the imaging sensor in response to absorption of the ionizing radiation; photogenerating charge in a charge generation layer of the imaging sensor in response to the optical radiation; providing transport of the charge through a charge transport layer of the imaging sensor thereby creating a net charge pattern at the imaging sensor wherein the net charge pattern generally corresponds to the ionizing radiation; uniformizing the charge pattern through injection of charge of either or both polarities into the imaging sensor thus causing currents to flow within the imaging sensor; and reading out the currents from the imaging sensor to provide a digital image representation corresponding to the charge pattern.

Preferably, the method for detecting ionizing radiation images also includes the step wherein the ionizing radiation is X-ray radiation.

BRIEF DESCRIPTION OF THE DRAWINGS

The present invention will be understood and appreciated more fully from the following detailed description, taken in conjunction with the drawings in which:

FIG. 9 is a simplified electrical circuit diagram of readout electronics forming part of the image detection module shown in FIGS. 2A, 2B and 3.

FIG. 10 is a simplified partially cut-away, partially pictorial, partially block diagram illustration of an Apparent Surface Voltages (ASV) sensor forming part of the image detection module shown in FIGS. 2A, 2B and 3.

FIGS. 11A, 11B, 11C and 11D are simplified illustrations useful in understanding the operation of the image detection module shown in FIGS. 2A, 2B, and 3.

DETAILED DESCRIPTION OF PREFERRED EMBODIMENTS

Figure 1:
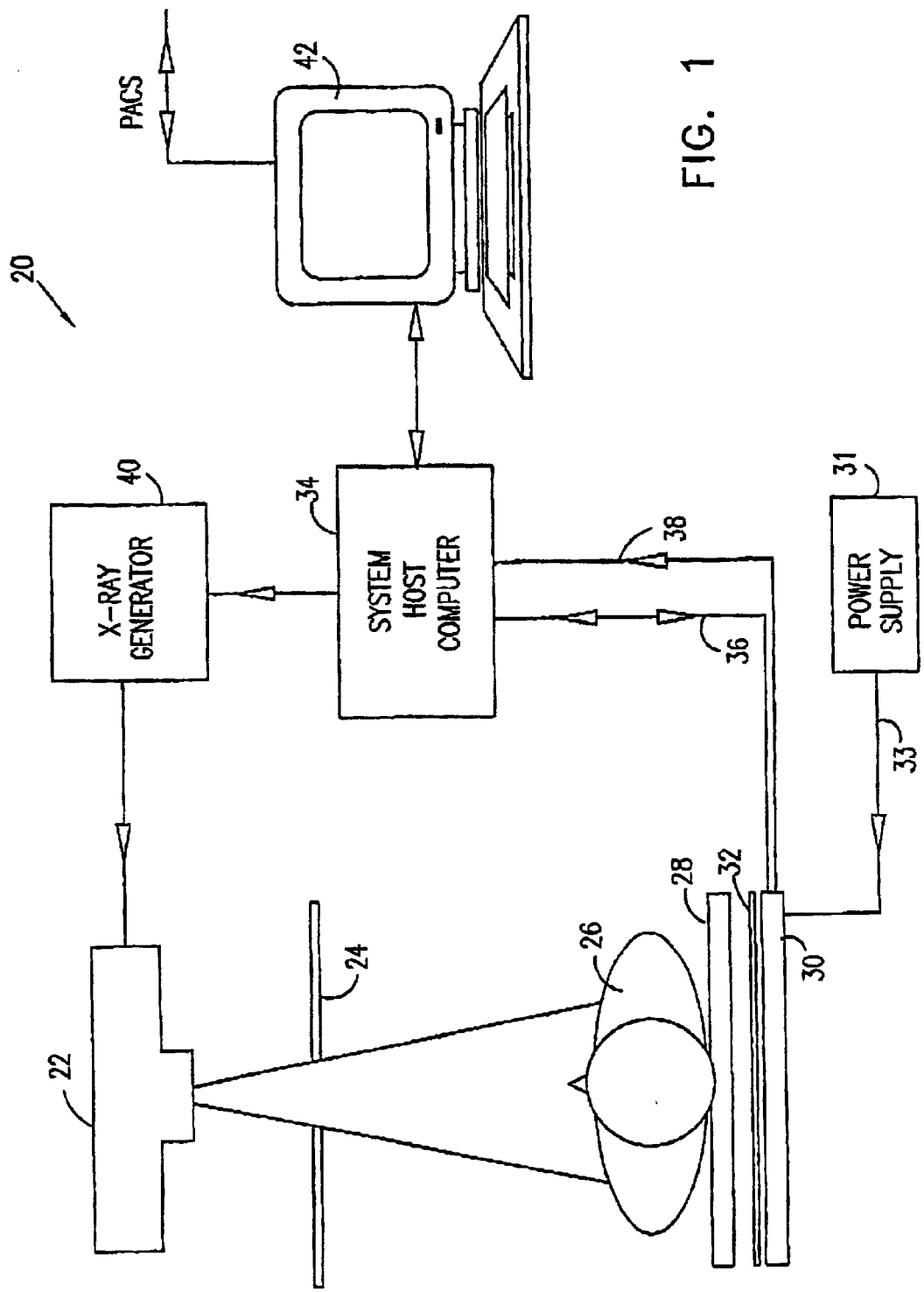
FIG. 1 illustrates a digital X-ray system incorporating an enhanced image detection module in accordance with a preferred embodiment of the present invention.

Reference is now made to FIG. 1 which illustrates a digital X-ray system in accordance with a preferred embodiment of the present invention.

FIG. 1 illustrates a digital X-ray imaging system 20, which includes an X-ray source 22 from which an X-ray beam is emitted. A collimator 24 preferably shapes the emitted X-ray beam. The X-ray beam impinges upon a patient 26 preferably lying on or standing in front of a X-ray permeable patient support 28. The X-ray beam then impinges upon an image detection module 30, which is preferably a flat panel digital X-ray detector as described hereinbelow. The image detection module 30 is preferably associated with an external power supply 31 which provides power via a power supply cable 33. The X-ray imaging system may include a radiation anti-scatter grid 32 as known in the art.

Typically, the collimator 24 includes two sets of movable lead shutters which are arranged to restrict and shape the X-ray beam to define a desired irradiation field area which is typically rectangular. By restricting the irradiated field to a relevant region of the patient's anatomy, the overall dose of the X-ray to the patient may be reduced and X-ray image contrast is enhanced due to reduced scattering of primary X-ray radiation.

Preferably, the operation of the image detection module 30 is controlled by a system host computer 34 typically including a controller and data processor. A communications link 36, which may use a standard communications protocol such as RS232 or USB, preferably connects the image detection module 30 to the system host computer 34 and is used for communication of control information. High speed transfer of imaging data from image detection module 30 to the data processor of system host computer 34 is preferably handled by a high speed data link 38 which may employ an electrical or fiber optic link. Alternately, the high speed data link 38 may be wireless.

The controller of system host computer 34 preferably controls an X-ray generator 40 to set the exposure parameters of X-ray source 22 such as tube voltage (kVp), tube current (milliamperes) and the maximum expected duration of an X-ray exposure pulse. These parameters are typically set in accordance with the requirements of a specific patient examination under operator control. In accordance with a preferred embodiment of the present invention, the actual duration of X-ray exposure is determined automatically as described hereinbelow.

In accordance with an alternative embodiment of the present invention, the exposure parameters of X-ray generator 40 may be input manually to a generator console (not shown).

Digital X-ray system 20 also preferably includes a monitor 42 which serves as an image display station and preferably also includes a user interface to the system operator.

It is appreciated that image detection module 30 may be used with X-ray systems for diagnostic imaging such as general radiography and mammography.

In the non-limiting example described herein, a general radiography system such as those sold by Philips Medical Systems International or Siemens Medical Systems, Inc. may form part of digital X-ray imaging system 20, which typically operates in the following manner:

Patient data is input to the monitor 42 and the examination that is to be carried out is preferably selected from an examination library. In accordance with the patient data and examination type, suggested exposure parameters are provided to a technologist from look up tables stored in a database of system host computer 34. Exposure parameters selected by the technologist are forwarded to the X-ray generator 40. Prior to exposure the technologist positions the patient in front of or on the X-ray permeable patient support 28. The technologist then preferably adjusts the X-ray source 22 and collimator 24 to spatially define the irradiation field. Alternatively, operation of the collimator 24 may be automated, with electromechanical means and sensing devices used to position X-ray source 22 and/or lead shutters of the collimator 24.

After patient positioning, an X-ray exposure is initiated by the technologist at monitor 42 or by using a dedicated manual prepare and expose switch. During patient exposure, the X-ray beam impinges on the patient and is imagewise modulated as it passes through the patient anatomy. Thus spatially modulated radiation which contains information relating to the patient's anatomy impinges on the image detection module 30. In accordance with a preferred embodiment of the present invention, exposure data is generated in real-time by image detection module 30 and transferred in real-time to the data processor of system host computer 34 through data link 38.

It is appreciated that the same data link 38 may be used for transfer of both integrated radiation data and real-time exposure data as described hereinbelow. The real-time exposure data is used to provide enhanced real-time dose control obviating the need for an automatic exposure control device as in prior art methodologies. Moreover, the present invention provides exposure sensors which are flexible in terms of aperture size and location enabling real-time feedback to be employed for optimized dose control as described hereinbelow. This contrasts with prior art fixed aperture and fixed location density sensors associated with phototimers and other exposure control devices. The present invention may thus enable a lowering of the dose required to reach desired diagnostic image contrasts for a variety of different types of examination.

Preferably, upon termination of patient exposure, raw image data, comprising integrated radiation values representing a digital image, is read out and transferred from image detection module 30 to the data processor of system host computer 34 via data link 38. The raw image data is preferably calibrated and then image processed to provide a display on the monitor 42 corresponding to the object that was imaged.

The digital image is preferably stored in or retrieved from a Picture Archiving and Communications System (PACS) via standard network communication preferably using the Digital Imaging and Communications in Medicine (DICOM) protocol as known in the art. Alternatively or additionally, digital images may be exported to a hard copy output device, such as a laser imager, to provide an image on film or any other suitable substrate.

Figure 2A:
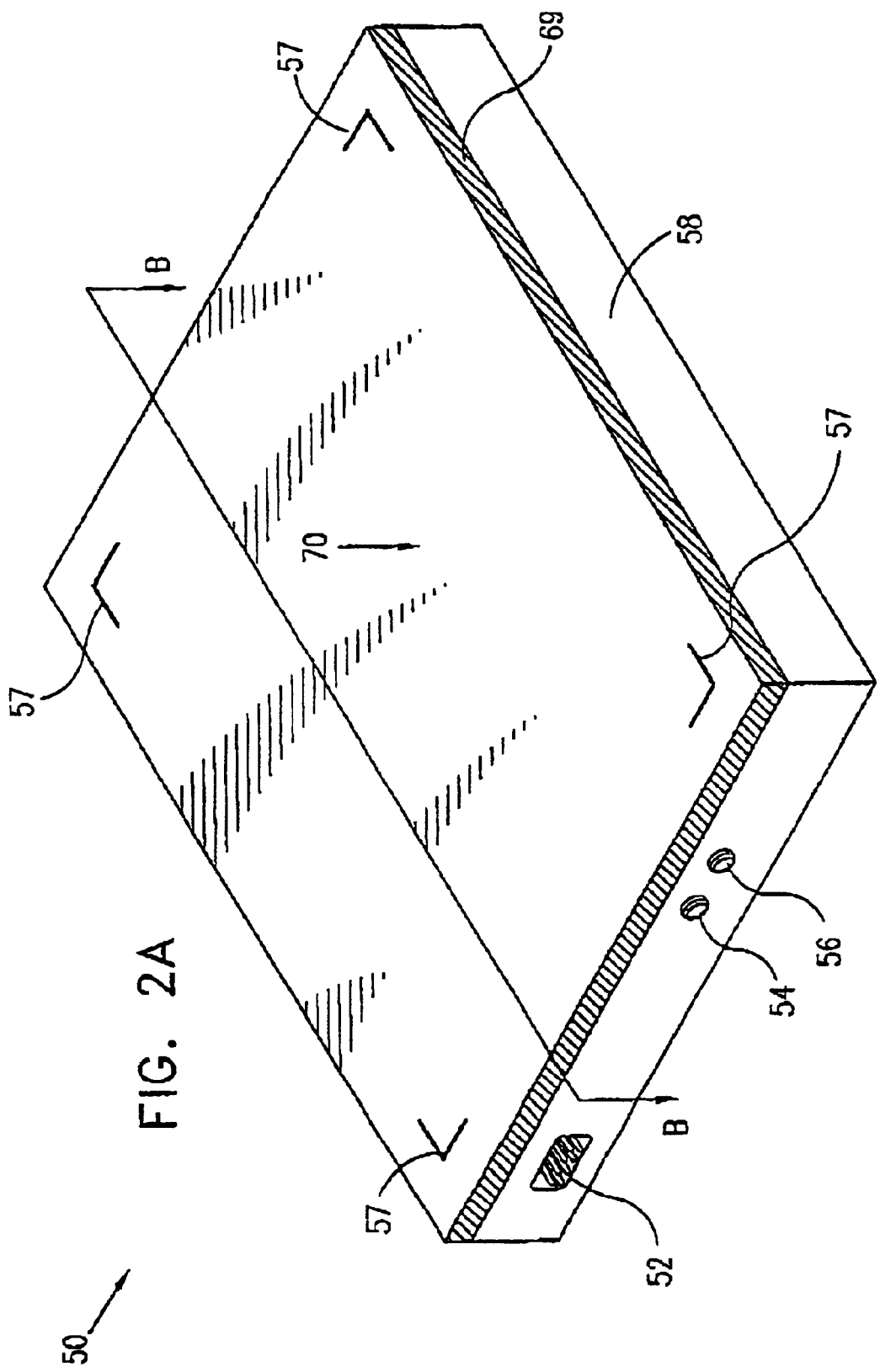
FIGS. 2A and 2B are respective simplified pictorial and sectional illustrations of an image detection module forming part of the system of FIG. 1, FIG. 2B taken over lines B—B of FIG. 2A.
Figure 2B:
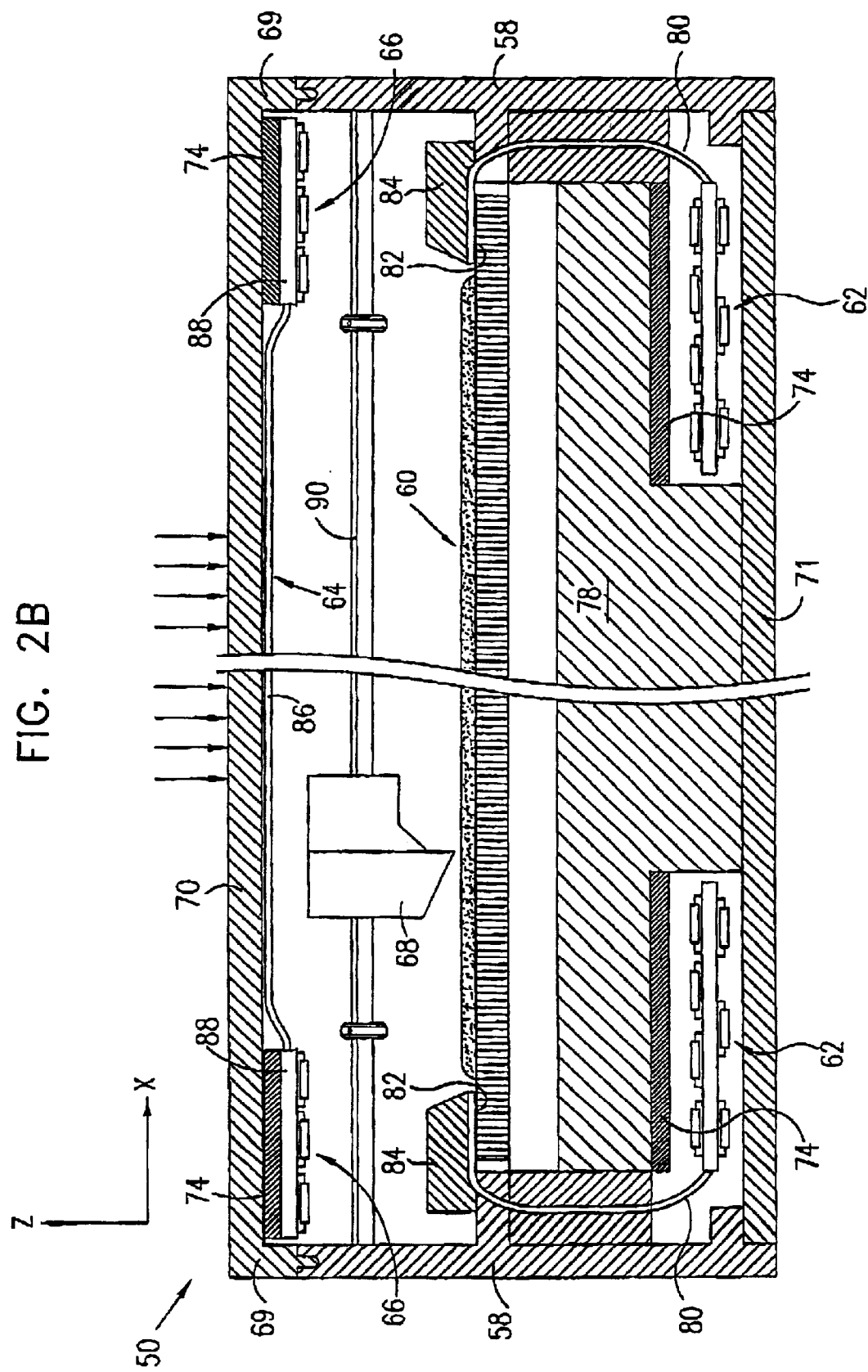

Reference is now made to FIGS. 2A and 2B which illustrate an image detection module 50 which may serve as image detection module 30 of FIG. 1 in accordance with a preferred embodiment of the present invention. Image detection module 50 typically includes a power connector 52, a control communication connector 54 and a high speed data output connector 56 which are connected to power supply cable 33 (FIG. 1), communications link 36 (FIG. 1), and high speed data link 38 (FIG. 1) respectively. Preferably, the imaging area of image detection module 50, indicated in FIG. 2A by reference markings 57, is at least 17"×17". Using an imaging area of this size allows image detection module 50 to be used for a variety of general radiography examinations, without additional mechanical swiveling.

Image detection module 50 preferably includes an outer casing 58 enclosing an X-ray sensor 60 and an apparent surface voltage (ASV) sensor 64 which are respectively associated with integrated radiation data readout electronics 62 and with real-time radiation data readout electronics 66. An elongate scanner 68, control electronics (not shown) and motion drivers (not shown) are also enclosed by outer casing 58.

Casing 58, which is preferably EMI-RFI protected and light shielding, is preferably formed of a lightweight electrically conducting material such as aluminum and may include a removable upper cover 69 and a removable lower cover 71. The casing 58 preferably includes at least one X-ray permeable region 70 and at least one X-ray shielded region 74.

Typically the X-ray permeable region 70 is an integral part of removable upper cover 69 of casing 58 as shown in FIG. 2B. Alternatively, X-ray permeable region 70 may also include a separate element formed of an X-ray permeable material such as carbon fiber and mounted on the upper cover 69.

Integrated radiation data readout electronics 62 and real-time radiation data readout electronics 66 are preferably located in X-ray shielded regions 74 of casing 58 and thus are protected from direct radiation exposure. X-ray shielded regions 74 are preferably formed by inserting highly X-ray absorbent material, such as lead inserts, into casing 58. An internal base 78, which serves as a base upon which X-ray sensor 60 is removably mounted, is preferably located in casing 58 and may be formed as an integral part thereof. X-ray sensor 60 preferably is a multilayer structure as described hereinbelow with particular reference to FIG. 3.

Figure 8:
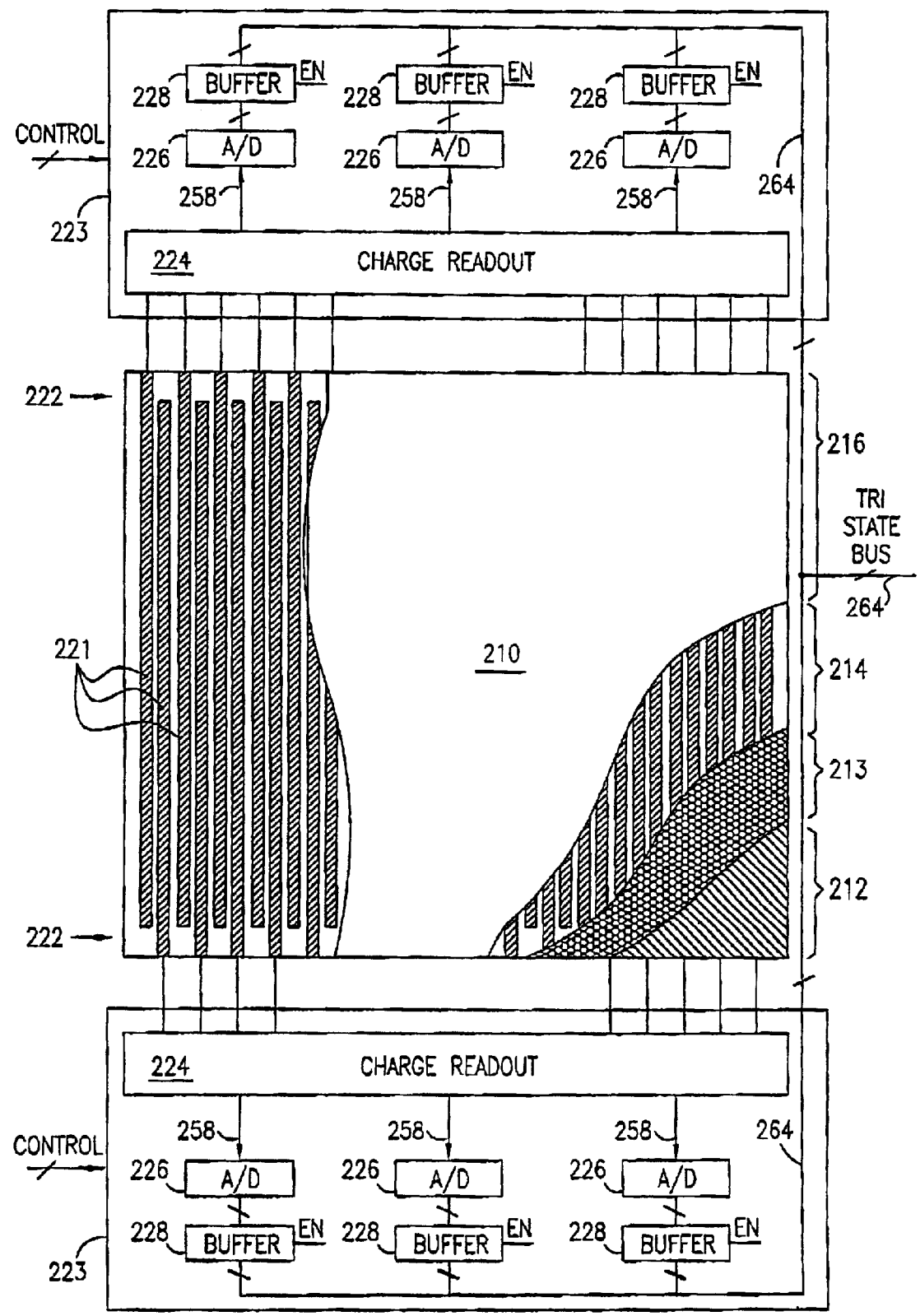
FIG. 8 is a simplified partially cut away, partially pictorial, partially block diagram illustration of an X-ray sensor forming part of the image detection module shown in FIGS. 2A, 2B and 3.

Integrated radiation data readout electronics 62 which is preferably operated as described hereinbelow with reference to FIGS. 8–9 is preferably mounted on at least one printed circuit board 80. Printed circuit board 80 preferably includes a flexible interconnect region through which permanent or removable connections are made in register to peripheral, non-active fan-out regions 82 of X-ray sensor 60 using alignment blocks 84. Removable connections, which enable integrated radiation data readout electronics 62 or alternatively X-ray sensor 60 to be removed for servicing or replacement, may be carried out by high density elastomeric zebra connectors or any other suitable connectors. Permanent connections may employ anisotropic electrically conducting adhesive films as known in the art.

ASV sensor 64, which provides a real-time indication of the radiation exposure at X-ray sensor 60, is preferably mounted on an inner surface of upper cover 69 of image detection module 50.

In accordance with a preferred embodiment of the present invention, ASV sensor 64, which overlies and faces X-ray sensor 60, is a multi-layer printed circuit board PCB having a flexible region 86 and at least one rigid region 88 as described hereinbelow with particular reference to FIG. 10. Preferably, the flexible region 86, which includes very thin X-ray permeable layers of polyimide and conductive material, is mounted beneath X-ray permeable region 70. The rigid region 88 of ASV sensor 64, on which real-time radiation data readout electronics 66 is preferably assembled, is preferably mounted beneath X-ray shielded regions 74 of upper cover 69. Alternatively, separate printed circuit boards containing real-time radiation data readout electronics 66 may be connected to the flexible region 86 of ASV sensor 64 using removable or permanent connections. High density elastomeric zebra connectors or other standard high density connectors may be used for removable connections, while permanent connections may employ anisotropic electrically conducting adhesive films as known in the art.

Elongate scanner 68, which preferably includes an elongate charge injector and may further include an elongate light source, is preferably as described hereinbelow with reference to FIG. 4. Typically, elongate scanner 68 is capable of sweeping back and forth over X-ray sensor 60 using conventional electromechanical means (not shown) to provide linear motion thereof along conventional linear guides 90.

Figure 3:
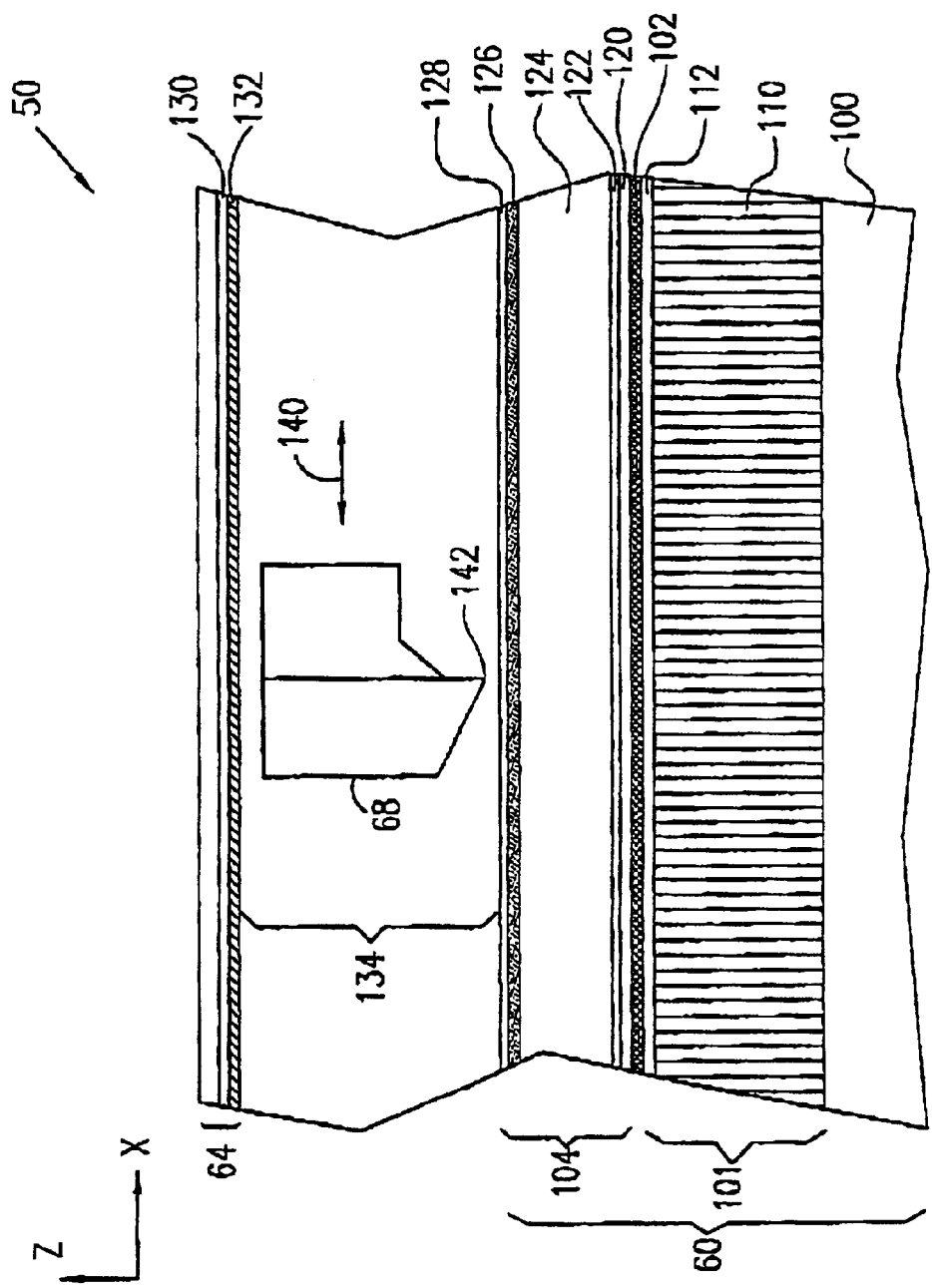
FIG. 3 is an enlarged illustration of part of the sectional illustration of FIG. 2B.

Reference is now made to FIG. 3 which is a cross-sectional view of an active portion of image detection module 50 (FIG. 2B) including X-ray sensor 60, elongate scanner 68, and ASV sensor 64. For the sake of simplicity, image detection module 50 is not shown in its entirety.

X-ray sensor 60 preferably comprises a layered stack including, from bottom to top in the drawing, a support substrate 100, a scintillator multilayer 101 formed onto and overlying support substrate 100, a conductive electrode array 102 overlying said scintillator multilayer 101 and a photoelectric conversion multilayer 104 overlying said conductive electrode array 102.

Support substrate 100 provides mechanical support and dimensional stability for X-ray sensor 60 and may serve as a base upon which layers 101, 102, and 104 are formed. Preferably support substrate 100 is either an optical radiation absorbing or reflecting surface and as such is preferably either generally totally absorbing of optical radiation or generally totally reflecting of optical radiation. An example of a support substrate 100 that may serve as a generally totally absorbing layer of optical radiation is amorphous carbon. An example of a support substrate 100 that may serve as a generally totally reflecting layer is aluminum or alumina. Typically, a generally reflecting layer provides increased light output of the scintillator multilayer 101 however at a lower spatial resolution, while a generally absorbing layer yields less light output but provides a higher spatial resolution.

Scintillator multilayer 101, which overlies support substrate 100, preferably includes an X-ray absorbing scintillator 110 and a protective overlayer 112.

It is appreciated that in accordance with a preferred embodiment of the present invention, X-ray photons are absorbed both by scintillator 110 and by photoelectric conversion multilayer 104. Harder radiation is typically absorbed by scintillator 110 and softer radiation is typically absorbed by photoelectric conversion multilayer 104. Alternately, and in accordance with the materials selected therefor, photoelectric conversion multilayer 104 may not contribute significantly to X-ray absorption.

Scintillator 110 may be formed of a material which efficiently absorbs X-ray radiation and converts it to optical radiation. An example of a suitable material for scintillator 110 is doped cesium iodide. Typically, for high resolution X-ray imaging, doped cesium iodide is deposited by evaporation to form a highly-packed, polycrystalline, columnar structure of needles which are several microns in diameter and several hundred microns long which is typically the thickness of scintillator 110. Use of cesium iodide as a scintillator and deposition thereof in needle form is commonly known in the art. The thickness of scintillator 110 is determined by a tradeoff between the desired X-ray absorption properties and the imaging spatial resolution. For general radiography, when using cesium iodide, the scintillator thickness is preferably in the range of 300–700 microns.

The dopant of the cesium iodide is preferably selected to match the optical properties of photoelectric conversion layer 104. In accordance with a preferred embodiment of the present invention, scintillator 110 is formed of cesium iodide doped with thallium CsI (Tl). It is appreciated that the CsI(Tl) is less hygroscopic and has relatively high light output when compared to other cesium iodide dopants commonly used in the art. The peak emission of the CsI (Tl) is centered at approximately 560 nanometers.

A particular advantage of the needle-like structure of scintillator 110 is improved spatial resolution of optical coupling between scintillator multilayer 101 and photoelectric conversion multilayer 104. Thus, optical radiation emitted as a result of scintillation is efficiently guided into photoelectric conversion multilayer 104, thereby reducing scatter and improving total conversion efficiency from x-ray radiation to charge carriers.

Protective overlayer 112, which preferably overlies and passivates scintillator 110, insulates the scintillator 110 from humidity and other external factors, such as chemicals. Protective overlayer 112 is preferably a poly-para-xylylenes layer, e.g. parylene, which is applied as a conformal coating at room temperature by vacuum deposition as known in the art. In accordance with an alternative embodiment of the present invention, protective overlayer 112 may further incorporate a benzocyclobutene layer or a polyimide layer which is preferably spin-coated and cured over the conformal coating to provide surface planarization of scintillator multilayer 101.

In accordance with a preferred embodiment of the present invention, conductive electrode array 102 comprises a plurality of transparent strip electrodes as shown with reference to strip electrodes 221 in FIG. 8, which are preferably mutually planar, elongate and parallel and which preferably end in fan-out regions as shown in FIG. 2B and FIG. 8.

Conductive electrode array 102 is preferably formed using photolithography and wet or dry etching techniques to pattern and segment a generally continuous conductive film which is deposited on a surface of scintillator multilayer 101. Alternatively, thermal ablation techniques such as laser ablation etching can be used for patterning and segmentation of the conductive film.

The conductive film is preferably a thin optically transmissive, X-ray permeable coating such as indium tin oxide (ITO), transparent gold film, or any other suitable material, which is typically deposited over scintillator multilayer 101 using conventional vacuum deposition techniques such as sputtering and thermal evaporation to provide a uniform generally pinhole-free conducting layer which is typically 100–1,000 angstroms thick. When transparent gold is used as the conductive material, the adhesion of the layer to the underlying layers may be enhanced by first depositing approximately 50 angstroms of chromium directly on the scintillator multilayer 101 and then depositing a gold film that is a few hundred angstroms thick.

The spectral transmission of the transparent gold film has a transmission maximum around 560 nanometer which matches well the peak emission of CsI(Tl).

The pitch between adjacent strip electrodes 221 (FIG. 8) of conductive electrode array 102 determines the resolution of image detection module 50 in the y-direction. For example, 5–10 line pairs per millimeter can be achieved by using strip electrodes 221 (FIG. 8) having a pitch of 100–50 microns, respectively. Preferably, the width of each strip electrode 221 (FIG. 8) is two to four times greater than the gap between adjacent electrodes.

Typically, integrated radiation data readout electronics 62 (FIG. 2B) are fixed or removably connected to connection fan-out regions (not shown) of conductive electrode array 102 as described hereinbelow.

In accordance with one preferred embodiment of the present invention, photoelectric conversion multilayer 104 is an element, preferably having from bottom to top in the drawing, the following layers: an optical-radiation-transparent charge blocking layer 120, a charge generation layer 122, and a photoconductive layer 124. In addition, photoelectric conversion multilayer 104 may further include an optical radiation blocking layer 126 and or a passivation layer 128 as a top coating.

Optical-radiation-transparent charge blocking layer 120 has two main characteristics: First, it generally prevents injection of charge from conductive electrode array 102 into photoelectric conversion multilayer 104 during electrical sensitization of X-ray sensor 60, therefore reducing dark current thereover. Second, it allows optical radiation emitted from scintillation multilayer 101 to be highly transmitted therethrough into charge generation layer 122.

Typically optical-radiation-transparent charge blocking layer 120 is of submicron thickness. Examples of a suitable material for optical-radiation-transparent charge blocking layer 120 are poly-para-xylylenes, silicon oxides and silicon nitride which may be vacuum deposited as known in the art. A further example of a suitable material is benzocyclobutene, which may be spin-coated and cured by a sol-gel process as known in the art.

Optical radiation emitted from scintillator multilayer 101 and transmitted through charge blocking layer 120 is absorbed in charge generation layer 122, causing photogeneration of free charge carrier pairs therein. In accordance with the preferred embodiment of the present invention described herein, charge generation layer 122, which is typically vacuum deposited to form a layer a few microns thick, is preferably formed of a selenium-based alloy, such as arsenic triselenide. Tellurium may be also added in a proportion of up to 30% by weight in order to shift the optical radiation sensitivity of the charge generation layer 122 toward longer wavelengths in order to achieve higher charge photogeneration efficiency when using scintillator 110 is formed from CsI(Tl).

It is appreciated that the precise material composition for charge generation layer 122 is selected such that its optical radiation sensitivity is matched to the light spectrum emission profile of scintillator 110 forming part of scintillator multilayer 101.

Photoconductive layer 124 preferably exhibits properties which make it suitable to serve as a charge transport layer, transporting charge carriers of at least one polarity that are generated within charge generation layer 122 by optical radiation. In accordance with this preferred embodiment of the present invention, photoconductive layer 124 also exhibits some level of X-ray absorption, particularly for softer radiation, i.e. longer X-ray wavelengths, and furthermore has a relatively high level of charge transport for charge carriers of both polarities. Thus, charge carriers of opposing polarities that are photogenerated as a result of X-ray photon absorption are transported in opposing directions and swept out of photoconductive layer 124.

In addition, photoconductive layer 124 preferably exhibits generally high dark resistivity yielding a low dark current, allowing an electric field to be maintained thereacross during X-ray imaging. Furthermore, photoconductive layer 104 is preferably characterized in that the density of charge carrier trap sites therein is low.

Amorphous selenium, which may be doped with arsenic and chlorine, exhibits the desirable properties described hereinabove for photoconductive layer 124. When doped amorphous selenium is used, the thickness of photoconductive layer 124 is between 10–100 microns and preferably in the range of 40–70 microns.

In accordance with an alternative embodiment of the present invention, photoconductive layer 124 may exhibit only charge transport characteristics transporting charge carriers of a single polarity that are generated within charge generation layer 122 by optical radiation while not exhibiting significant photogeneration to X-ray. In this case, a suitable organic material such as a polyvinyl carbazole may be used to form a negative charge transport layer.

Optional optical radiation blocking layer 126 is preferably a mono- or multi-layer structure with a thickness of several microns. Optical radiation blocking layer 126, which overlies photoconductive layer 124 typically absorbs a wide spectral band of non-ionizing radiation, such as undesired soft UV, visible and near infra-red radiation, preventing penetration of the non-ionizing radiation into photoconductive layer 124 and charge generation layer 122, while allowing ionizing radiation to pass therethrough.

Alternatively, optical radiation blocking layer 126 may have low pass optical filtering properties thereby blocking a narrower optical radiation spectral band, in order to tailor the optical radiation spectrum which can penetrate photoelectric conversion multilayer 104 from its top surface. In this case, radiation photons having energy greater than the band gap energy of photoconductive layer 124 and charge generation layer 122 are preferably blocked by the optical radiation blocking layer 126. Thus radiation photons, which would cause direct photogeneration of free charge carriers in photoconductive layer 124 and charge generation layer 122, are blocked by optical radiation blocking layer 126 and prevented from reaching those layers. By contrast, photons having energy below the band gap energy of photoconductive layer 124 are preferably transmitted through optical radiation blocking layer 126 with relatively low absorption therein. Those photons which cause charge excitation from the valence band to energy states below the conductive band, such as trap states, are transmitted through optical radiation blocking layer 126 and therefore are not prevented from interaction with photoconductive layer 124.

For example, when doped amorphous selenium is used as photoconductive layer 124, the photon cutoff energy of optical radiation blocking layer 126, beyond which photons are highly absorbed and below which photons are weakly absorbed, is preferably around 2 electron-volts.

It is a particular feature of the present invention that the optical spectral filtering characteristics of optical radiation blocking layer 126 are particularly useful in allowing external optical radiation employed for trap state occupation to penetrate photoconductive layer 124 as described hereinabove. Allowing the external optical radiation to be projected directly into photoconductive layer 124 in the same direction as the impingement of the ionizing radiation efficiently reduces ghost effects. The problem of ghosting between successive images is known in the art. Using an optical radiation blocking layer 126 having a low pass filtering with a radiation blocking layer with photon cutoff energy, the present invention overcomes the known problems of ghosting by employing external optical illumination to saturate trap states during electrical sensitization of X-ray sensor 60, thereby reducing ghosting effects during imaging as described hereinbelow with reference to FIG. 11A.

In addition to its optical filtering properties, optical radiation blocking layer 126 generally limits the passage of charge, of at least one polarity therethrough. Optical radiation blocking layer 126 is preferably characterized by a very short charge transit range for charge carriers of at least one polarity thus functioning also as a unipolar or bipolar charge blocking layer. This is typically caused by a high level of charge trapping for charges of at least one charge polarity.

Preferably when optical radiation blocking layer 126 is a unipolar charge blocking layer, charges of the sensitizing polarity are blocked and retained as space charges at the surface and/or within the bulk of optical radiation blocking layer 126.

When photoconductive layer 124 is amorphous selenium, optical radiation blocking layer 126 is preferably formed by vacuum deposition of an alkali doped selenium layer, of several microns thickness, to provide a unipolar positive charge blocking layer as well as optical radiation blocking for wavelengths shorter than 600 nanometers associated with the cutoff energy of amorphous selenium.

Alternatively, optical radiation blocking layer 126 may be prepared using a dielectric polymer carrier which is loaded with a mix of selected absorbing pigments/dyes to achieve a desired absorption spectral band while maintaining charge transport properties as described hereinabove. When this type of optical radiation blocking layer 126 is employed, the thus prepared optical radiation blocking material is preferably deposited using conventional coating techniques for organic materials, such as dip coating, spin coating, and spraying.

Where necessary, an optional passivation layer 128 may be deposited over optical radiation blocking layer 126 to chemically and physically passivate the underlying layers of X-ray sensor 60.

Examples of a suitable material for passivation layer 128 are dielectric polymers such as poly-para-xylylenes which may be applied as a conformal coating at room-temperature by vacuum deposition as known in the art. Preferably, the thickness of passivation layer 128 is in the range of a few microns.

In accordance with an alternative embodiment of the present invention, X-ray sensor 60 includes a slightly modified layer configuration. In this alternative embodiment, scintillator 110 is formed of cesium iodide doped with sodium CsI (Na) and photoconductive layer 124 is formed of doped amorphous selenium. It is appreciated that the peak emission of CsI (Na) is centered at approximately 420 nm. As opposed to the peak emission of CsI(Tl) which is used in the preferred embodiment, doped amorphous selenium is highly sensitive to the emission spectrum of CsI(Na). Thus, photoconductive layer 124 provides charge photogeneration as well as charge transport in the same layer. Thus, the use of charge generation layer 122 is obviated and light emitted from the scintillator 110 may be coupled directly into photoconductive layer 124.

In addition to X-ray sensor 60, image detection module 50 comprises ASV sensor 64 which is preferably a multi-layer structure including at least one dielectric support layer 130 and a charge tracking layer 132 as described hereinbelow with reference to FIG. 10.

A space 134, which is preferably occupied by a suitable gas such as air, at at least approximately atmospheric pressure, preferably separates the charge tracking layer 132 of ASV sensor 64 from top surface of X-ray sensor 60.

As indicated by FIG. 3, elongate scanner 68 sweeps over X-ray sensor 60 along an axis 140 in the x-direction in the space 134 separating ASV sensor 64 from X-ray sensor 60. Sweeps of elongate scanner 68 may be operative to electrically sensitize X-ray sensor 60 and/or to read a charge pattern corresponding to time-integrated X-ray radiation which impinged upon X-ray sensor 60 as described hereinbelow with particular reference to FIGS. 11A–11D.

In the z-direction, elongate scanner 68 is preferably separated from the top surface of X-ray sensor 60 at a defined distance which is typically selected to maintain 0.1 mm–0.3 mm between a wedge 142 of elongate scanner and the top surface of X-ray sensor 60. It is appreciated that, within this range, maintaining a precise distance between wedge 142 of elongate scanner 68 and top surface of X-ray sensor 60 is not critical to the operation of image detection module 50.

In order to achieve a fairly compact and generally flat image detection module 50 (FIG. 2), the z-dimension of elongate scanner 68 is preferably fairly small, typically 5–15 mm, with the space 134 sufficient to allow clearance of the elongate scanner 68 during sweeping scans.

Figure 4:
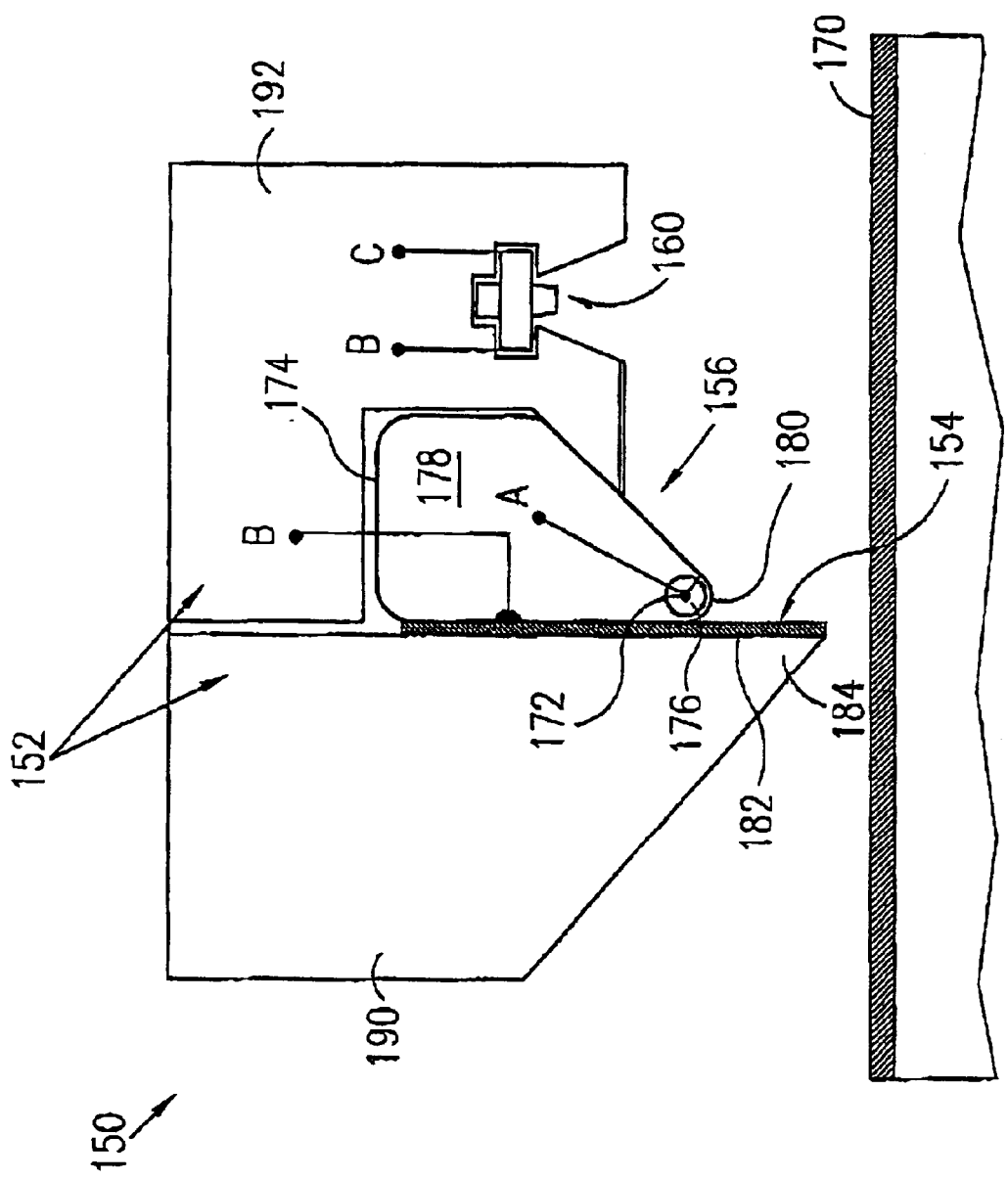
FIG. 4 is a further illustration of part of the sectional illustration of FIG. 2B.

Reference is now made to FIG. 4 which is a sectional illustration of an elongate scanner 150, constructed and operative in accordance with a preferred embodiment of the present invention, which may serve as elongate scanner 68 (FIGS. 2B and 3).

For the sake of simplicity, an X-ray sensor which may be identical to X-ray sensor 60 (FIG. 3) is not shown in its entirety in FIG. 4, and only a top surface 170 thereof is shown.

Elongate scanner 150 preferably includes an electrically insulating housing assembly 152 and a charge injector 156. In addition, elongate scanner 150 may include an elongate light source 160 which is preferably employed for trap state saturation within photoconductive layer 124 (FIG. 3) of X-ray sensor 60 (FIG. 3) as described herein.

Preferably, charge injector 156 includes an embedded elongate electrode 172, having an external terminal A, and an exposed screen electrode 174, having an external terminal B. Embedded elongate electrode 172 is preferably a thin conductive wire electrode, having a thickness of several hundred microns and having a thin dielectric coating 176, such as glass, typically several tens of microns in thickness. Embedded elongate electrode 172 is preferably mounted onto an elongate dielectric support 178, which is typically a rod formed of glass, alumina or other dielectric ceramic. Exposed screen electrode 174 is preferably formed by winding a thin conductive wire having a thickness of several tens of microns into generally mutually spaced coils over elongate dielectric support 178 and embedded electrode 172.

It is appreciated that alternative configurations for an embedded elongate electrode and elongate screen electrode are possible, it being appreciated that the relationship between and the geometry of embedded elongate electrode, exposed screen electrode and dielectric coating determine the capacitance and therefore the electrical impedance of charge injector 156 which is driven by an AC voltage source.

Charge injector 156 is activated, continuously or in bursts, by applying between terminal A of embedded elongate electrode 172 and terminal B of exposed screen electrode 174 a modulated AC voltage which is typically a floating sine wave with an amplitude on the order of 2000–2,500 volts peak-to-peak and a frequency between several tens of kilohertz to a few megahertz. The AC voltage is selected to produce an AC electric field sufficiently strong to cause discharge in air at exposed regions of dielectric coating 176 where exposed screen electrode 174 intersects embedded elongate electrode 172. Thus, in accordance with the structure described herein, an elongate discharge site 180 is defined, at which discharge occurs during activation of charge injector 156.

The aforesaid discharge preferably results in the generation of a relatively large quantity of positive and negative charges, with the amount of charge generated generally dependent on the frequency and amplitude of the AC voltage. A fraction of the generated charge may be injected onto top surface 170 in the following manner: Charges (positive or negative) are preferably injected from elongate discharge site 180 into top surface 170 by injection forces created when a bias voltage VB is applied between exposed screen electrode 174 and the conductive electrode array 102 (FIG. 3) of X-ray sensor 60 (FIG. 3) underlying top surface 170. Typically bias voltage VB is an adjustable and controlled DC voltage in the range of 0–1000 volts.

Preferably, and in order to allow the injection of the thus generated charges into top surface 170 to be efficiently controlled by bias voltage VB, exposed screen electrode 174 is configured to electrostatically shield embedded elongate electrode 172, having the AC voltage applied thereto, from X-ray sensor 60 (FIG. 3).

Charge injection from charge injector 156 into optical radiation blocking layer 170 is typically self-quenching. Space charges created by the accumulation of charge at top surface 170 progressively reduce the injection forces to a generally negligible value. Because the injection preferably include charges of both polarities, initial or residual charge at top surface 170 does not generally influence the final accumulated charge density at X-ray sensor 60 (FIG. 3). Instead, the final accumulated charge density is primarily determined by the polarity and amplitude of bias voltage VB. It is appreciated that the actual amount of charge injected by charge injector 156 at each location of X-ray sensor 60 (FIG. 3) corresponds to the charge density retained thereat prior to charge injection.

Charge injection into top surface 170 is spatially tailored by an electrostatic barrier 182, which transverses conductive electrode array 102 (FIG. 3) of X-ray sensor 60 (FIG. 3). Electrostatic barrier 182 is preferably formed by deposition a thin conducting coating having a thickness of several microns to several tens of microns along a vertical face of a dielectric wedge 184. Wedge 184, which is typically formed of an electrically insulating material such as glass or ceramic, is preferably an integral part of electrically insulating housing assembly 152. Alternatively, when wedge 184 is formed of ceramic, electrostatic barrier 182 may be formed along a vertical face thereof by co-firing metallization as known in the art. It is appreciated that electrically insulating housing assembly 152 also provides elongate scanner 156 with mechanical stiffness and straightness.

Preferably, electrostatic barrier 182 is in direct electrical contact with exposed screen electrode 174 and is biased to the same bias voltage VB. As a result, the electric field along the electrostatic barrier 182 is tailored such that injected charges are directed to top surface 170 along wedge 184, while charge flow at regions of the top surface 170 beyond electrostatic barrier 182 is generally prevented.

Electrically insulating housing assembly 152 is typically formed of two subassemblies 190 and 192 which are fastened using conventional mechanical means (not shown). When fastened, subassemblies 190 and 192 securely hold and align charge injector 156.

In accordance with one non-limiting embodiment of the present invention, elongate light source 160, which is capable of projecting light onto X-ray sensor 60, is embedded in subassembly 192 of electrically insulating housing assembly 152.

Preferably, elongate light source 160 includes an elongate, linear array of individual light emitting diodes (LEDs) with two external terminals, B and C for electrical power delivery, as described hereinbelow with reference to FIG. 6.

It is a particular feature of a preferred embodiment of the present invention that radiation energy emitted by elongate light source 160 is used to efficiently fill and saturate trap states across photoconductive layer 124 (FIG. 3) as described herein. Accordingly, the emission peak wavelength of the LEDs is selected such that the photon energy associated therewith is lower than the photon cutoff energy of optical radiation blocking layer 170 as described hereinabove. For example, when photoconductive layer 124 (FIG. 3) is doped amorphous selenium, elongate light source 160 preferably emits radiation with a peak wavelength preferably longer than 600 nanometers, such as conventional red LEDs.

Figure 5:
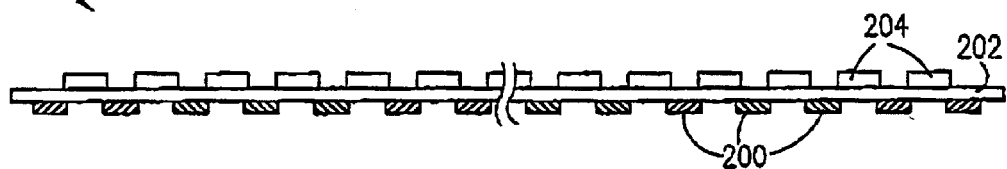
FIG. 5 is a simplified illustration of an elongate light source useful in the structure shown in FIG. 4.

Reference is now made to FIG. 5 which illustrates a cross section of one preferred embodiment of elongate light source 160 in accordance with the present invention. As mentioned above, elongate light source 160 preferably includes a plurality of light emitting diode chips (LEDs) 200 which are arranged in an elongate array and are preferably surface mounted to one side of a rigid printed circuit board (PCB) 202. Preferably, a plurality of resistors 204, which control the current flowing through the LEDs 200, and thus LED brightness, are surface mounted on the opposite side of PCB 202.

Preferably, elongate light source 160 is designed to be insertable into subassembly 192 (FIG. 4) of insulating housing assembly 152 (FIG. 4). It is appreciated that the example described herein provides one non-limiting embodiment of elongate light source 160 and that alternative light sources such as an aperture fluorescent elongate lamp may be employed.

Figure 6:
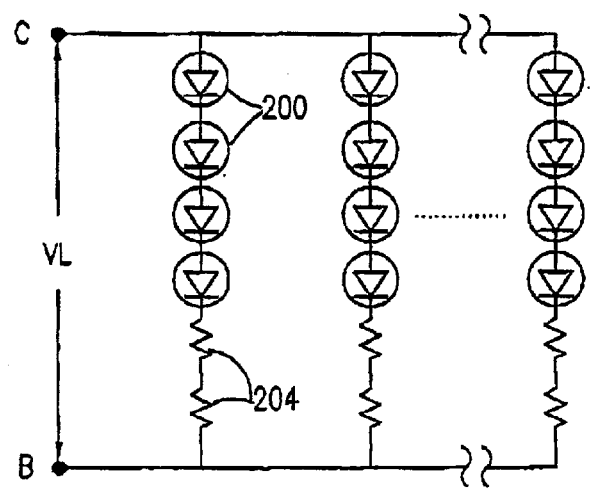
FIG. 6. is a simplified electrical diagram of the elongate light source of FIG. 5.

Reference is now made to FIG. 6, which illustrates an electrical circuit diagram of elongate light source 160 including an array of LEDs 200 assembled on PCB 202 (FIG. 5). Preferably, LEDs 200 are divided into parallel-connected groups. Within each group, the LEDs 200 are serially connected to one or more current-limiting resistors 204. Preferably, LEDs 200 are driven by a single floating DC voltage source VL, applied between terminals B and C which preferably correspond to terminals B and C of FIG. 4. VL is typically on the order of several tens of volts.

Figure 7:
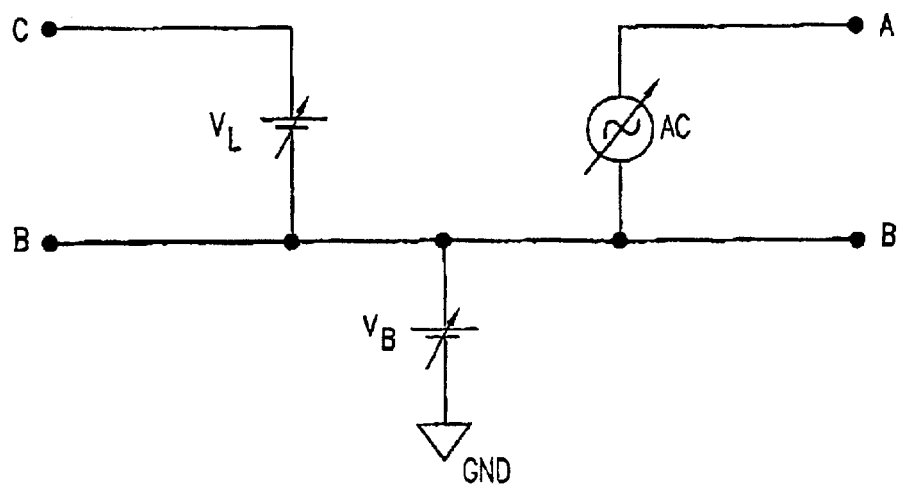
FIG. 7 is a simplified electrical circuit diagram of a power driver driving the structure shown in FIG. 4.

Reference is now made to FIG. 7 which is an electrical diagram of power drivers which drive charge injector 156 and elongate light source 160 of elongate scanner 150 of FIG. 4 in accordance with a preferred embodiment of the present invention. It is appreciated that the charge injector 156 and elongate light source 160 of elongate scanner 150 may be activated individually or concurrently in the following manner:

As mentioned above, charge injector 156 (FIG. 4) is activated, continuously or by bursts by corresponding modulation of the floating AC voltage applied between terminal A of embedded elongate electrode 172 and terminal B of exposed screen electrode 174. Charge injection is driven by bias voltage VB which is applied to terminal B, relative to ground associated with conductive electrode array 102 (FIG. 3) of X-ray sensor 60 (FIG. 3).

As further mentioned above, the elongate light source 160 (FIG. 4) is activated by applying a floating DC voltage, VL, between terminals B and C of elongate light source 160 (FIG. 4).

As shown by FIG. 7, charge injector 156 and elongate light source 160 preferably float on the same high DC bias voltage, VB, applied to terminals B. This eliminates electrical stress between the circuitry of elongate light source 160 and charge injector 156 and also between elongate light source 160 and X-ray sensor 60 (FIG. 3).

Reference is now made to FIG. 8 which is a partially cut away top view schematic illustration of an X-ray sensor 210, constructed and operative in accordance with a preferred embodiment of the present invention. Preferably, X-ray sensor 210 is a multilayer structure similar to that of X-ray sensor 60 described hereinabove with particular reference to FIG. 3. X-ray sensor 210 preferably comprises a layered stack having a support substrate 212, a scintillator multilayer 213, a conductive electrode array 214, and a photoelectric conversion multilayer 216.

Support substrate 212, scintillator multilayer 213, conductive electrode array 214 and photoelectric conversion multilayer 216 are preferably identical to support substrate 100, scintillator multilayer 101, conductive electrode array 102 and photoelectric conversion multilayer 104 respectively, all described hereinabove with reference to FIG. 3.

As seen in FIG. 8, conductive electrode array 214 typically includes a plurality of co-planar elongate electrodes 221 ending in fanout regions 222.

Integrated radiation data readout electronics 223, which may serve as integrated radiation data readout electronics 62 (FIG. 2B), is preferably coupled to X-ray sensor 210. Integrated radiation data readout electronics 223 preferably includes charge readout circuitry 224, a plurality of analog to digital converters 226, and data bus buffers 228. Typically, charge readout circuitry 224 comprises a plurality of multi-channel analog, low-noise charge readout ASICs 231 as described hereinbelow with particular reference to FIG. 9. Preferably, the ASICS are mounted on printed circuit board 80 (FIG. 2B) using standard chip-on-board techniques.

Typically, for an X-ray sensor 210 having an imaging area of 17"×17", conductive electrode array 214 comprises about 3600 electrodes 221 (FIG. 8). The number of readout channels of multi-channel charge readout ASICs 231 (FIG. 9) is equal to or greater than the number of conductive electrodes 221 of conductive electrode array 214, with each electrode 221 being connected to a single readout channel. Alternatively, several electrodes 221 may be connected to a single channel, thereby reducing the spatial resolution in one dimension. Therefore, in accordance with this example, charge readout circuitry 224 preferably comprises fifteen multichannel charge readout ASICs 231 (FIG. 9) each associated with a fanout region 222, each ASIC 231 (FIG. 9) including 120 readout channels.

In accordance with a preferred embodiment of the present invention, connections between electrodes 221 and charge readout circuitry 224 are carried out at two connection fanout regions 222 located at opposing, non-active, peripheral regions of X-ray sensor 210. Preferably, half of the electrodes 221 are connected through the first connection fanout region and the remaining half are connected through the second connection fanout region such that adjacent electrodes are connected to opposing connection fanout regions. In this manner, the density of connections at each connection fanout regions is reduced. Conventional connection technologies such as those mentioned hereinabove may thus be used to provide removable or permanent electrical connection between X-ray sensor 210 and integrated radiation data readout electronics 223.

It is appreciated that, with the exception of the ASICS 231 (FIG. 9), the components of integrated radiation data readout electronics 223 are typically mounted on PCB 80 (FIG. 2B) using SMT techniques as known in the art.

Reference is now made to FIG. 9, which illustrates the charge readout circuitry 224 of FIG. 8 in accordance with a preferred, non-limiting, embodiment of the present invention.

As noted above, the charge readout circuitry 224 preferably includes a plurality of multi-channel readout ASICs 231. Each multi-channel charge readout ASIC 231 preferably comprises three primary stages: a charge amplifier stage 232, a sample and hold stage 234, and a multiplexer 236.

For each readout channel, the charge amplifier stage 232 comprises a low-noise, frequency band-width limited, bi-directional charge integrator 238, associated with a feedback capacitor 240, to define a charge amplifier gain, and a solid-state reset switch 242 to periodically reset the charge integrator 238. Feedback capacitor 240 can be selected to provide a suitable gain in accordance with the specific parameters of the X-ray sensor 210 (FIG. 8).

The charge amplifier stage 232 typically receives a bi-directional flow of charges from electrodes 221 (FIG. 8) and provides corresponding positive or negative output voltage values, each output voltage value representing the accumulated charge at a single charge integrator 238 between consecutive resets by reset switch 242. Output voltage values from the charge amplifier stage 232 are sampled by sample and hold stage 234, each readout channel corresponding to a synchronized dual sample and hold circuit 244. Synchronized dual sample and hold circuit 244, which provides generally continuous sampling, typically includes two sub-circuits 246 and 248, each of which preferably contains a capacitor 250 and two solid state switches 252.

During readout, one of the two sub-circuits 246 and 248 samples a value from charge amplifier stage 232 while the other holds a previously sampled value to provide the held value to be sampled by the multiplexer 236 through a buffer 256.

At predetermined time intervals, in accordance with the read sampling frequency which determines the width of each raster line of the image being read, the functions of sub-circuits 246 and 248 are interchanged between sampling and holding by solid state switches 252 in preparation for readout of a new raster line. Immediately after interchange, charge integrator 238 is instantaneously reset via reset switch 242 also causing reset of the sub-circuit 246 or 248, which is in a sampling mode, thereby integration and sampling is associated only with charge from the raster line being read.

In FIG. 9, as indicated by the states of solid state switches 252, sub-circuit 246 is shown as sampling the output of charge integrator 238, after a reset has been completed, while sub-circuit 248 is shown as holding a previously sampled value to be sampled by multiplexer 236 through buffer 256.

It is appreciated that generally uninterrupted continuous sampling, as implemented by sample and hold circuitry 234 or by any other suitable circuitry, is of particular importance when the charge injector 156 (FIG. 4) of elongate scanner 150 (FIG. 4) is continuously activated as described hereinabove.

Multiplexer 236 provides a parallel-to-serial conversion of the integrated analog data from the readout channels by sequentially addressing each buffer 256 at a rate determined by the frequency of a clock CLK supplied by a controller (not shown). Typically, with each CLK pulse, the analog output of a subsequent buffer 256 is provided to a common output line 258 through buffer 260. The common output line 258 is preferably shared by a group of cascaded multi-channel charge readout ASICs 231, thereby providing a common output line for the group of cascaded multi-channel charge readout ASICs 231. Each common output line 258 corresponds to a single cascade.

Signals CSI and CSO are used to provide cascade functionality to the multi-channel charge readout ASICs 231. Each multi-channel charge readout ASIC 231 is selected by a chip select input signal CSI, which closes switch 262 to allow transfer of held analog data from buffers 256 to common output line 258. When the last buffer 256 has transferred its analog data to output line 258, a chip select output signal CSO is provided by the multiplexer 236 of multi-channel charge readout ASIC 231. CSO causes switch 262 to be disconnected and provides a CSI signal for the next multi-channel charge readout ASIC 231 in the cascade. Through ASIC cascading, it is appreciated that a group of ASICs performs as a single expanded ASIC.

It is appreciated that data representing a raster line is sampled in parallel at all electrodes 221 (FIG. 8) by all cascades of multi-channel charge readout ASICs 231, each cascade associated with a single output line. During the time required for parallel sampling of one raster line of charge data, the hold data of all buffers 256, representing a previously sampled raster line of charge data, is serially output concurrently along output lines 258 of the cascades.

Referring back to FIG. 8, each output line 258 is associated with a corresponding A/D converter 226 which provides an analog to digital conversion. The A/D conversion typically has a resolution of between 14 and 8 bits, depending on whether a tone scale remapping function is employed during readout, as described hereinbelow with reference to FIG. 13. Output digital signals are transferred from all A/D converters 226 to a common data bus output 264 through data bus buffers 228, each data bus buffer 228 preferably comprising tri-state outputs.

During readout of integrated data from X-ray sensor 210, digital data is serially transferred concurrently from all A/D converters 226 to corresponding data bus buffers 228 at a first transfer rate. Data from all data bus buffers 228 is serially transferred to the common output data bus 264 at a second transfer rate using Enable signals EN, supplied by a controller (not shown), to sequentially address each data bus buffer 228 thereby to enable data output therefrom. Typically, the second transfer rate is significantly higher than the first transfer rate. Thus the analog-to-digital conversion may be performed at a relatively low rate, simplifying integrated data readout circuitry 222 and reducing the cost of A/D converters 226.

It is appreciated that the sequence of data transfer from the various data bus buffers 228 is selected in order to provide proper reconstruction of raster lines being read, in accordance with the structure of fanout regions 222 and the order in which electrodes 221 are electrically connected to charge readout circuitry 224.

It is further appreciated that the digital data output on data bus 264 provides a digital representation of spatially modulated X-ray integrated radiation impinging on X-ray sensor 210 corresponding to an object being imaged.

Reference is now made to FIG. 10 which is a partially cut away bottom view schematic illustration of an ASV sensor 270 which may serve as ASV sensor 64 (FIG. 2B), constructed and operative in accordance with a preferred embodiment of the present invention. ASV sensor 270 is preferably a multi-layer printed circuit board, having a flexible region 272 and a rigid region 274 which may serve as flexible region 86 and rigid region 88, respectively, in the embodiment of FIG. 2B.

The flexible region 272 is preferably a thin, X-ray permeable polyimide-based multi-layer PCB having, in downstream to upstream order with respect to the direction of X-ray impingement: a charge tracking layer 276, a dielectric layer 278, a fanout layer 280, and a dielectric support layer 282. Both charge tracking layer 276 and fanout layer 280 are preferably very thin patterned conducting layers, each having a thickness of several microns so as to be X-ray permeable. It is appreciated that the ASV sensor 270 is oriented within an image detection module such as image detection module 50 (FIG. 2B) such that the charge tracking layer 276 faces X-ray sensor 60 (FIG. 2B).

Charge tracking layer 276 is preferably a gold-coated copper layer, formed by conventional PCB manufacturing technologies to provide an array of generally coplanar discrete plate electrodes 274, preferably arranged in X rows and Y columns. The structure of plate electrodes 274 determines the sensing apertures of the ASV sensor 270. Preferably, plate electrodes 274 are square having dimensions in the range of several millimeters by several millimeters to tens of millimeters by tens of millimeters, in accordance with the desired resolution of ASV sensor 270 as described hereinbelow. It is appreciated that plate electrodes 274 with other geometries or dimensions may be employed.

Each plate electrode 274 is preferably associated with a dedicated output line 283. During exposure to X-ray, real-time radiation data, in the form of charges, flows from each individual plate electrode 274 to a corresponding individual channel of real-time radiation data readout electronics 278 via corresponding output lines 283.

Output lines 283 are preferably routed in fanout layer 280, which is generally electrostatically shielded from X-ray sensor 60 (FIG. 2), by charge tracking layer 276, thereby reducing cross-talk between signals of the ASV sensor 270. Alternatively, output lines 283 may be formed as part of charge tracking layer 272, the routing of the output lines 283 ensuring that the area occupied thereby is significantly smaller than the area of plate electrodes 274, in order to reduce signal cross-talk. When output lines 283 are formed as part of charge tracking layer 272, the need for fanout layer 280 is obviated.

In accordance with an alternative embodiment of the preferred invention, charge tracking layer 276 may comprise a relatively small number of large-area, fixed shape plate electrodes which serve as regional sensors having sensing apertures similar to those of ion chamber conventional automatic exposure control devices. It is appreciated that information sensed by the ASV sensor in this case is not imagewise but instead is analogous to that sensed by regional density sensors and may include several distinctly readable fields. The advantage of the approach described herein is that the ASV sensor forms a simple integral component of image detection module 50 (FIG. 3).

In addition to the thin multi-layer of the flexible region 272, the rigid region 274 preferably also comprises a glass fiber epoxy laminate such as FR4. The rigid region 274 is preferably a substrate on which real-time radiation data readout electronics 284 is mounted using chip-on-board techniques and/or SMT as is known in the art. Fanout layer 280, which extends over the flexible region 272 and the rigid region 274, provides electrical interconnections between plate electrodes 274 and real-time radiation data readout electronics 284 through via holes (not shown) as known in the art.

Real-time radiation data readout electronics 284 preferably includes charge readout circuitry 286, analog to digital (A/D) converters 288 and data bus buffers 290. It is appreciated that the functionality of real-time radiation data readout electronics 284, namely reading out of data in the form of flowing charges, is similar to the functionality of integrated radiation data readout electronics 223 (FIG. 8). Thus, charge readout circuitry 286, analog to digital (A/D) converters 288 and data bus buffers 290 are typically identical to charge readout circuitry 224, analog to digital (A/D) converters 226 and data bus buffers 290 respectively described with respect to FIG. 8. However, since the amplitudes of currents flowing to real-time radiation data readout electronics 284 may be different than the amplitudes of currents flowing to integrated radiation data readout electronics 223 (FIG. 8), the embodiment of FIG. 10 preferably uses charge integrators (not shown) that may have gains different from those of charge integrators 238 (FIG. 9). It is appreciated that the sampling time between two subsequent resets of the real-time radiation data electronics 284 determines the time required to readout an entire frame of data from all plate electrodes 274 in parallel.

It is appreciated that the number of input channels of charge readout circuitry 286 preferably corresponds to the number of plate electrodes 274. The number of plate electrodes 274 is preferably in the range of hundreds to several thousand. It is appreciated that increasing the number of plate electrodes 274 provides increased spatial resolution of ASV sensor 270 and higher resolution imagewise data. The precise number of plate electrodes 274 is selected in accordance with a tradeoff between the number of plate electrodes 274 required to provide generally imagewise real-time radiation information, which is preferably large, and the number of plate electrodes 274 required for real-time data processing, which is preferably small.

In accordance with a real-time processing algorithm described hereinbelow for detecting the borders of an irradiated field across X-ray sensor 60 (FIG. 3), a global group 294 of plate electrodes 294 included within borders of the irradiated field may be defined. Alternatively or additionally, regional groups 296 of plate electrodes 274 may be defined in accordance with the algorithm described hereinbelow with respect to FIG. 13.

Readout of real-time radiation data by charge integration provides realtime exposure data which is used for real-time dose control. Dose control allows optimization for each examination, thereby eliminating inaccuracies resulting from imperfect registration and patient alignment relative to an automatic exposure control device in prior art methodologies. Moreover, instead of using prior art fixed aperture and fixed location density sensors typically associated with prior art phototimers and other exposure control devices, the present invention provides generally imagewise real-time exposure data which enables real-time image contrast feedback to be employed for dose optimization as described hereinbelow. The present invention may thus enable a lowering of the dose required to reach desired diagnostic contrasts for a variety of different types of examination.

Apparent surface voltages of an X-ray sensor 60 (FIG. 3) or of X-ray sensor 210 (FIG. 8), which correspond to the amount of radiation absorbed thereby, are detected by ASV sensor 270 in real-time during exposure to X-ray radiation in the following manner: ASV sensor 270 is biased to a ground potential via real-time radiation data readout electronics 284. Due to the electrostatic conditions in the space 134 (FIG. 3) between X-ray sensor 60 (FIG. 3) and ASV sensor 270, as described hereinbelow with particular reference to FIG. 11B, the charge redistribution in charge tracking layer 272 generally tracks and corresponds to the net charge pattern generated at X-ray sensor 60 (FIG. 3) during exposure. Charge redistribution in charge tracking layer 272 causes measurable currents to flow in real-time radiation readout electronics 284, thereby providing signal representation of apparent surface voltages of X-ray sensor 60 (FIG. 3).

The sensitivity of the charge tracking is a function of the space 134 (FIG. 3) separating the ASV sensor 270 from X-ray sensor 60 (FIG. 3) and the strength of the electric field thereacross. The spatial resolution of ASV sensor 270 is limited by the spatial resolution of the charge tracking, with the actual resolution being determined by the dimensions and quantity of plate electrodes 274 and space 134 (FIG. 3).

It is appreciated that in the embodiment shown in FIG. 10, ASV sensor 270 comprises a single multilayer PCB. However, and in accordance with the size of the image detection module 50 (FIG. 2B) in which ASV sensor 270 is incorporated, the ASV sensor 270 may in fact comprise several multilayer PCB's each comprising flexible regions 272 and rigid regions 274 tiled to create an expanded flexible region 272 to providing a larger sensing area for the ASV sensor 270.

It is further appreciated that an ASV sensor similar in structure to ASV sensor 270 may be useful in sensing apparent surface voltages for other detector systems or purposes where real-time indication of the apparent surface voltages provides useful system feedback.

Reference is now to made to FIGS. 11A–11D which illustrate the operation of an image detection module 300 constructed and operative in accordance with a preferred embodiment of the present invention. Image detection module 300 may serve as image detection module 30 in the embodiment of FIG. 1 or as image detection module 50 in the embodiment of FIG. 2B.

Image detection module 300 preferably includes a casing (not shown), enclosing an X-ray sensor 302 coupled to integrated radiation data readout electronics 304, an ASV sensor 306 (FIG. 11B) coupled to real-time radiation data readout electronics 308 (FIG. 11B), an elongate scanner 310, control electronics (not shown), motion drivers (not shown) and electrical power drivers as described hereinabove.

The casing (not shown) of image detection module 300 is preferably identical to casing 58 (FIG. 2B).

A space 312 (FIG. 11B), which is filled with a gas such as air at preferably atmospheric pressure, separates ASV sensor 306 (FIG. 11B) and X-ray sensor 302. X-ray sensor 302 preferably comprises a layered stack as described hereinabove with particular reference to FIG. 3, including, from bottom to top, a support substrate 100 (FIG. 3) not shown in FIGS. 11A–11D, a scintillator multilayer 314, a conductive electrode array 332 and a photoelectric conversion layer 334.

The scintillator multilayer 314, conductive electrode array 332 and photoelectric conversion multilayer 334 are preferably identical to scintillator multilayer 101 (FIG. 3), conductive electrode array 102 (FIG. 3), and photoelectric conversion multilayer 104 (FIG. 3) respectively.

For the purpose of the discussion which follows, conductive electrode array 332 can be considered, electrostatically, as being a continuous electrode, inasmuch as the gaps between the strip electrodes thereof are typically below the overall operating resolution of image detection module 300.

Integrated radiation data readout electronics 304, which is employed to read-out integrated radiation data in the form of charges after exposure, is preferably as described herein with particular reference to FIGS. 8–9.

ASV sensor 306 is preferably identical to that described herein with reference to ASV sensor 64 (FIG. 3) or ASV sensor 270 (FIG. 10). As seen in FIG. 11B, a charge tracking layer 337 of ASV sensor 306 faces X-ray sensor 302. Preferably, charge tracking layer 337 is biased to a ground potential via real-time radiation data readout electronics 308.

Real-time radiation data readout electronics 308, which is preferably employed to read out real-time exposure data, is identical to that described herein with particular reference to FIG. 10.

Elongate scanner 310, which preferably comprises a charge injector 338 having an elongate electrostatic barrier 340, may further comprise an elongate light source 342. Elongate scanner 310 is preferably identical to that described hereinabove with reference to elongate scanner 150 (FIG. 4). Conventional electro-mechanical means (not shown) are preferably employed to drive the motion of elongate scanner 310 back and forth over X-ray sensor 302 along the X-axis.

Figure 11C:
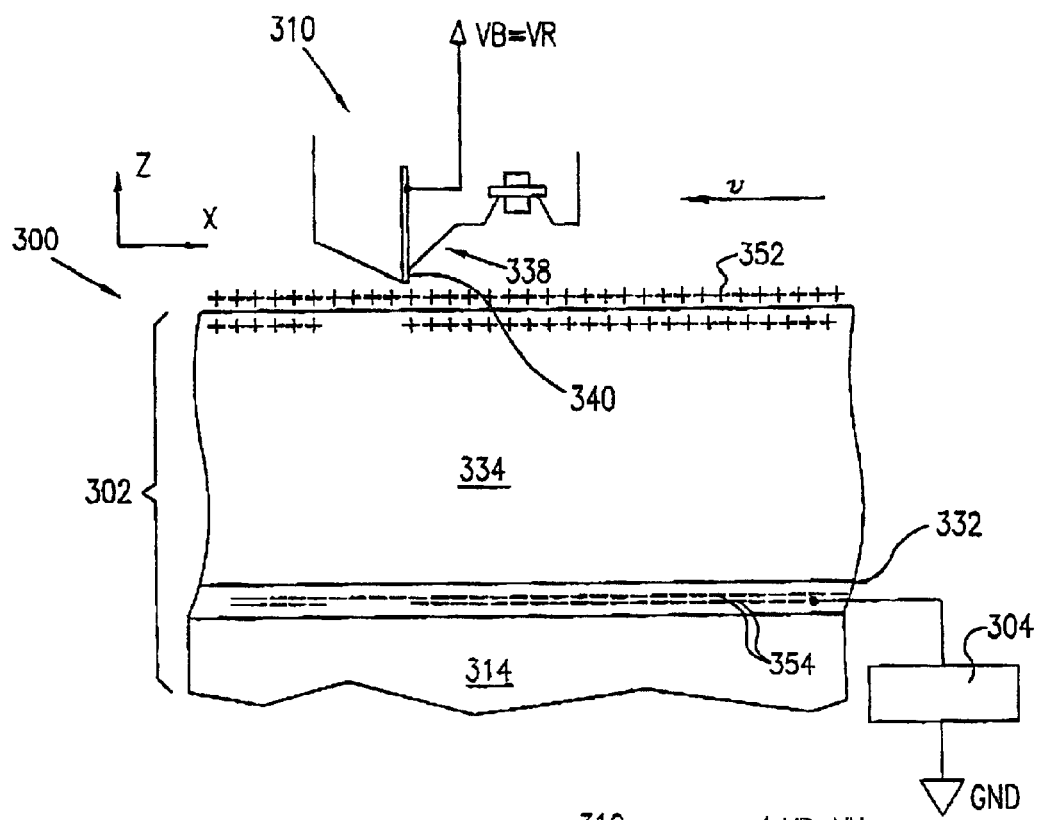
Figure 11D:
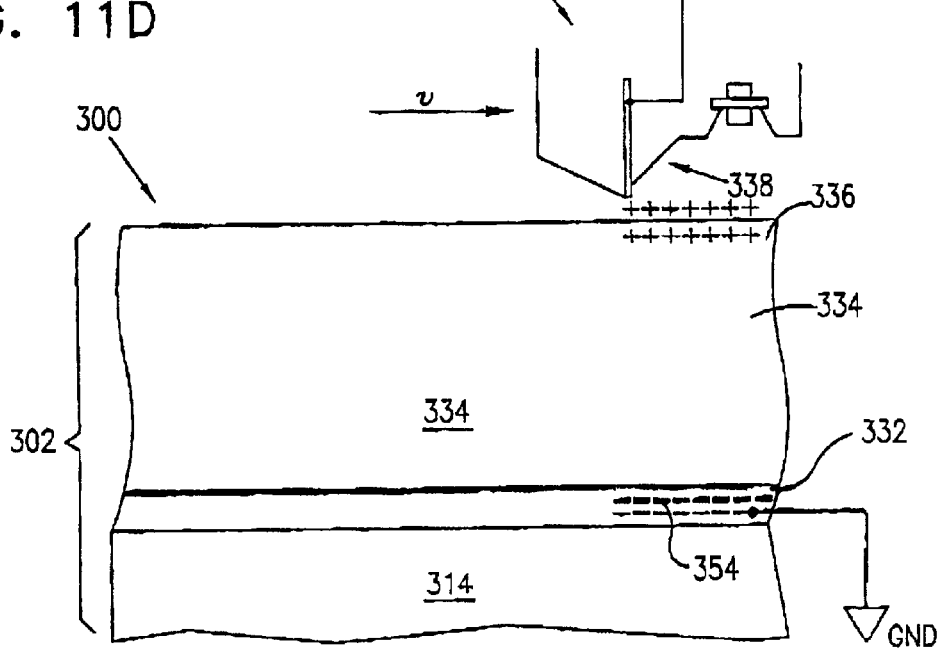
Figure 12:
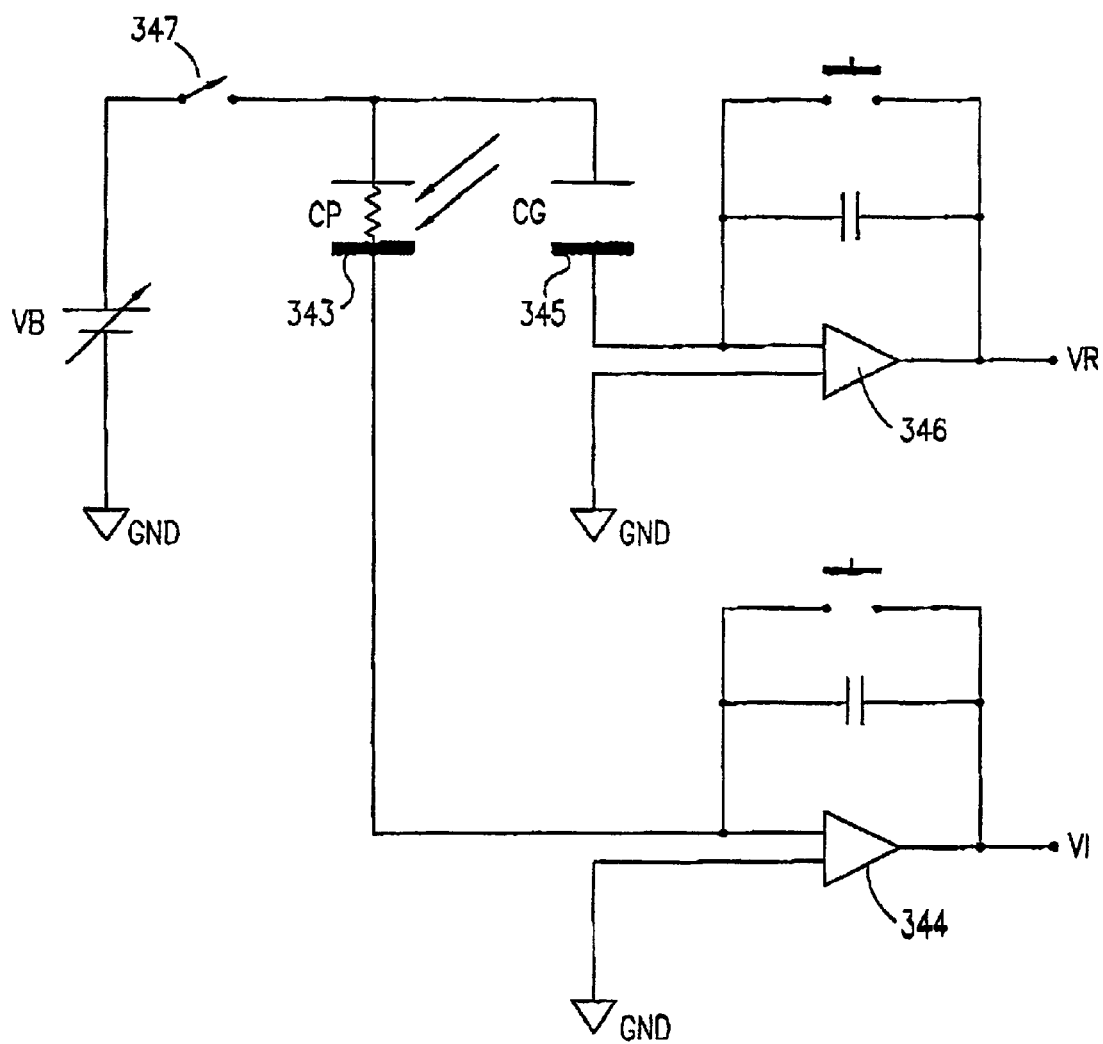
FIG. 12 is a block diagram illustrating the steps of an algorithm for processing imagewise real-time exposure data in accordance with a preferred embodiment of the present invention.

Reference is now made to FIG. 12 which is a schematic circuit diagram showing a simplified electrical equivalent of the image detection module 300 of FIGS. 11A–11D, useful in understanding the present invention.

A capacitor CP indicates a specific capacitance of X-ray sensor 302 (FIG. 11A), while a capacitor CG indicates a specific capacitance of ASV sensor 306 (FIG. 11B), that is the capacitance created between charge tracking layer 337 (FIG. 11B) and the top surface of X-ray sensor 302 (FIG. 11B) through associated space 312 (FIG. 11B).

As seen in FIG. 12, an electrode 343 of capacitor CP representing a single electrode 221 (FIG. 8) of conductive electrode array 332 (FIG. 11A) is electrically coupled to a charge integrator 344, representing a single channel, of integrated radiation data readout electronics 304 (FIG. 11A). An electrode 345 of capacitor CG, representing a single plate electrode 274 (FIG. 10) of charge tracking layer 337 (FIG. 11B), is electrically coupled to a charge integrator 346 representing a single channel of real-time radiation data readout electronics 308 (FIG. 11B). Capacitors CP and CG are connected in parallel through the ground of charge integrators 344 and 346.

Adjustable bias potential VB represents the bias voltage applied to a screen electrode and electrostatic barrier of charge injector 338 (FIG. 11A) as described hereinabove with reference to FIG. 4. A switch 347 is an electrical equivalent representing the effect of activation of charge injector 338 (FIG. 11A).

Referring back to FIG. 11A, the electrical sensitization of X-ray sensor 302 preferably occurs in the following manner:

Prior to a sweep of elongate scanner 310, the bias voltage VB is adjusted to a sensitizing bias value VS. The sensitizing bias voltage VS is applied to the exposed screen electrode 174 (FIG. 4) of charge injector 338 and to electrostatic barrier 340 relative to a ground potential GND associated with conductive electrode array 332 through integrated radiation data readout electronics 304.

While sensitizing bias voltage VS is applied thereto, elongate scanner 310 sweeps across X-ray sensor 302, and charge injector 338 is activated. During the sweep, self-quenching charge injection from charge injector 338 causes X-ray sensor 302 to be charged to an apparent surface voltage (ASV) which corresponds to the sensitizing bias voltage VS. Self-quenched charge injection is described hereinabove with particular reference to FIG. 4.

Preferably, when the photoconductive bulk of photoelectric conversion multilayer 334 is amorphous selenium-based, sensitizing bias voltage VS is preferably positive, yielding a distribution of positive charges at the top surface of photoelectric conversion multilayer 334, which distribution is generally uniform as shown in FIG. 11A. Since voltage VS is positive in accordance with this example, the optical radiation blocking layer 126 (FIG. 3) of photoelectric conversion multilayer 334 preferably has a short transit range for charges of positive polarity and may, in accordance with one embodiment of the present invention, also have a short transit range for negative polarity charges. As a result of the short transit range for positive charges, following sensitization, positive charges are typically retained at the top surface of X-ray sensor 60 (FIG. 3). If a optical radiation blocking layer 124 (FIG. 3) is used and is thus the top surface of X-ray sensor 60 (FIG. 3), charge is retained within optical radiation blocking layer 126 (FIG. 3), and/or at the interface between optical radiation blocking layer 126 (FIG. 3) and photoconductive layer 124 (FIG. 3) of photoelectric conversion multilayer 334. Retained charges at the top surface of X-ray sensor 60 (FIG. 3) cause a uniform electric field to be created across photoelectric conversion multilayer 334.

Typically, the value of sensitizing voltage VS, which is selected in order to create a high, but sustainable, electric field across photoelectric conversion multilayer 334, is on the order of several hundred to a thousand volts, with the exact value depending on the thickness of photoelectric conversion multilayer 334. If photoelectric conversion multilayer 334 is amorphous selenium-based, the desired field strength is typically in the range of 5–20 volts/micron, and preferably is 10 volts/micron corresponding to a VS value of up to a thousand volts.

Creation of an electric field within photoelectric conversion multilayer 334 causes electrical sensitization in preparation for exposure to X-ray radiation. Electrical sensitization is typically carried out immediately after a PREPARE trigger is received by image detection module 300. The PREPARE trigger may be a result of a technologist pressing a manual prepare switch, such as those employed with conventional X-ray systems, prior to initiation of X-ray exposure.

Concurrent with activation of charge injector 338 and during the sweep of elongate scanner 310 over X-ray sensor 302, elongate light source 342 may be activated causing optical radiation to be emitted by elongate light source 342 and projected through optical radiation blocking layer 126 (FIG. 3) into photoconductive layer 124 (FIG. 3) of photoelectric conversion multilayer 334. The illuminating optical radiation is employed to excite charge carriers from the valence band to occupy most of the trap states distributed across photoconductive layer 124 of photoelectric conversion multilayer 334 as described hereinabove. The trap states are thus saturated prior to X-ray radiation exposure.

It is a particular feature of the present invention that radiation photons, whether from the elongate light source 342 or the charge injector 338 or any other optical radiation source, having photon energy above the band gap of photoconductive layer 124 (FIG. 3) of photoelectric conversion multilayer 334 are preferably absorbed in optical radiation blocking layer 126 (FIG. 3) and thus blocked from reaching photoconductive layer 124 (FIG. 3) of photoelectric conversion multilayer 334. This filtration prevents undesirable direct photo-generation of free charge carriers, and associated dark decay, within photoelectric conversion multilayer 334 during the electrical sensitization.

The charge tracking layer 337 (FIG. 11B) is biased to ground via real-time radiation data electronics 308. Thus a uniform electric field is created in space 312 (FIG. 11B) when X-ray sensor 302 is charged to an apparent surface voltage (ASV) corresponding to sensitizing voltage VS, and a uniform charge distribution is created in the charge tracking layer 337. In the electrical circuit equivalent of FIG. 12, completion of sensitization is represented by closing switch 347 and charging capacitors CP and CG to a value of VB=VS.

Turning now to consideration of FIG. 11B, it is seen that FIG. 11B illustrates exposure of image detection module 300 to spatially modulated X-ray imaging radiation 350. During exposure to X-ray radiation, elongate scanner 310 is stationary, overlying non-active regions of X-ray sensor 302, which may be regions which are shielded from X-ray radiation as described hereinabove thus the elongate light source 342 and charge injector 338 are not typically directly exposed to X-ray radiation. Accordingly, elongate scanner 310 is not illustrated in FIG. 11B.

It is appreciated that in accordance with this preferred embodiment of the present invention, X-ray imaging radiation 350 is primarily absorbed by scintillator multilayer 314. In addition, and in accordance with the X-ray absorption characteristics thereof, X-ray imaging radiation 350 may also be absorbed by photoelectric conversion multilayer 334, with the absorbed radiation in both multilayers constituting a transmission modulated X-ray image of an object, such as a region of the human body.

Absorbed X-ray radiation results in photogeneration of charge carriers through two paths: Charge carriers are directly photogenerated as a result of X-ray absorption in photoconductive layer 124 (FIG. 3) of photoelectric conversion multilayer 334 and also indirectly generated as a result of X-ray absorption in scintillator 110 (FIG. 3) of scintillator multilayer 314 and emission of optical radiation by scintillator 110 (FIG. 3). This optical radiation is directed and coupled into a bottom surface of photoelectric conversion multilayer 334 through generally transparent electrode array 332, causing photogeneration of charge carriers at the bottom surface.

Photons, whether X-ray or optical, which are more energetic than the band gap of the photoconductive layer 124 (FIG. 3) or alternatively, more energetic than the band gap of the charge generation layer 122 (FIG. 3) of photoelectric conversion multilayer 334, create free electron/hole pairs in accordance with the spatially modulated pattern of the impinging X-ray radiation. The electric field present across photoelectric conversion multilayer 334, causes the electron/hole pairs which survive recombination to separate as free charge carriers of opposite polarities which transit in opposing directions along electric field lines which are perpendicular to the plane of photoelectric conversion multilayer 334.

In the example shown in FIGS. 11A–11D, positive charges are retained at the top surface of X-ray sensor 302 during electrical sensitization. Thus, following exposure and corresponding generation of free charge carrier pairs in photoelectric conversion multilayer 334, negative charge carriers move towards the top surface of X-ray sensor 302. This causes imagewise reduction of the positive net charge at the top surface of X-ray sensor 302 thereby creating a net charge pattern 352, which corresponds to the spatially modulated X-ray imaging radiation 350.

It is a special feature of the present invention that photoelectric conversion multilayer 334 is sensitive both to X-ray radiation and optical radiation: For X-ray radiation, charge generation and charge transport of opposing polarity charges occur in photoconductive layer 124 (FIG. 3) of photoelectric conversion multilayer 334, while for optical radiation, photoconductive layer 124 (FIG. 3) behaves as a charge transport layer for charges that are photogenerated in charge generation layer 122 (FIG. 3) as a result of absorption of optical radiation that is emitted by scintillator 110 (FIG. 3).

Moreover, the spectral sensitivity of photoelectric conversion multilayer 334 can be adjusted by selecting an appropriate charge generation layer 122 (FIG. 3) as described hereinabove.

X-ray exposure and creation of the net charge pattern 352 yields patterning of the previously uniform ASV at X-ray sensor 302. This patterning causes modification of the electrostatic fields across photoelectric conversion multilayer 334 and across space 312 with two primary effects. An imagewise charge redistribution occurs within conductive electrode array 332 yielding a spatially modulated charge replica 354 in conductive electrode array 332 which tracks and mirrors the net charge pattern 352 at the top surface of X-ray sensor 302. As a result, charge replica 354 also represents the transmission modulated X-ray imaging radiation 350.

In addition, as a result of changes in the ASV of X-ray sensor 302, corresponding charge redistribution occurs in the plate electrodes 274 (FIG. 10) of charge tracking layer 337. The charge redistribution causes measurable currents to flow through real-time radiation data electronics 308, providing a real-time indication of X-ray exposure on X-ray sensor 302.

Charge redistribution at charge tracking layer 337 may be better understood by referring briefly to the equivalent circuit of FIG. 12. Switch 347 is disconnected during exposure since the charge injector is not activated. Since CP and CG are connected in parallel, charge depletion at CP due to photogeneration as a result of X-ray or optical radiation absorption causes charge redistribution at CG yielding measurable current at charge amplifier 346. Charge redistribution ends when the voltage across CG becomes equal to that across CP.

Referring back to FIG. 11B, the amount of X-ray radiation exposure is sensed by ASV sensor 306, and the X-ray radiation exposure is controlled using feedback from real-time radiation data readout electronics 308 to system host computer 34 (FIG. 1) as described herein to provide automatic exposure termination and dose control. Alternatively, X-ray exposure may be terminated after the elapse of a predetermined amount of time, set by a technologist.

Providing real-time radiation sensing functionality in image detection module 300 obviates the need for external phototimers or automatic exposure control (AEC) apparatus and methods. Elimination of such apparatus enables reduction of the distance separating the image detection module 300 from the object being imaged with correspondingly decreased image magnification. In addition, providing real-time radiation functionality sensing by image detection module 300 eliminates the need for calibration and correction which would otherwise be required to compensate for the differences in spectral sensitivities at different X-ray tube kVp values that would occur were an external AEC device to be used.

Moreover and importantly, real-time radiation data is sensed by ASV sensor 306 without interfering with or attenuating the actual imaging data, which corresponds to the spatial modulation of X-ray imaging radiation 350, detected by X-ray sensor 302.

It is appreciated that real-time radiation data is read out from the ASV sensor 306 during X-ray exposure only. During other stages in imaging, the ASV sensor has no role. Therefore the ASV sensor 306 and readout electronics 308 are not illustrated in FIGS. 11A, 11C, and 11D.

Reference is now made to FIG. 11C which illustrates the reading of an X-ray image detected via X-ray sensor 302 by sequential line-by-line charge injection from sweeping elongate scanner 310 causing raster lines of the net charge pattern 352 to be sequentially generally uniformized.

Following exposure and prior to commencement of reading, bias voltage VB is adjusted to a value VR During reading, elongate scanner 310 sweeps across X-ray sensor 302 at a velocity v in the direction shown in FIG. 11C in synchronization with the operation of integrated radiation data readout electronics 304. Velocity v is determined and controlled by the electromechanical means which drive the motion of elongate scanner 310. During the sweep, charge injector 338 is activated and self-quenched charge injection from charge injector 338 into the top surface of X-ray sensor 302 occurs along elongate electrostatic barrier 340.

During the sweep of elongate scanner 310, the charge injector 338 may be periodically activated in bursts in accordance with a charge sampling time of a raster line as described hereinabove with reference to FIG. 8. Alternatively, the charge injector 338 may be continuously activated during reading, independently of the charge sampling time. In accordance with either embodiment, the time elapsed between subsequent charge sampling determines the width of each raster line of the image being read.

With each reading of a raster line during the sweep, elongate scanner 310, a new line of net charge pattern 352 along electrostatic barrier 340 is uniformized to an ASV value which generally corresponds to bias voltage VR. At regions on the top surface of X-ray sensor 302 which are beyond the dynamic position of electrostatic barrier 340 during the sweep, the electric field is tailored by electrostatic barrier 340 to shield the ASV at X-ray sensor 302 from the charge injector 342. Thus, charge injection to regions beyond electrostatic barrier 340 is generally prevented. The ASV of X-ray sensor 302 at those regions maintains imagewise patterning in accordance with the X-ray image information.

It is appreciated that the region of X-ray sensor 302 exposed to charge injection in the x-direction during reading is typically limited in one x-direction by electrostatic barrier 340, but in the second x-direction no such spatial confinement typically exists. Thus, the region of X-ray sensor exposed to charge injection along the X-axis is typically greater than the width of one raster line and may comprise many raster lines. However, regions at which net charge pattern 352 has been made uniform, that is regions not shielded by electrostatic barrier 340, generally do not undergo further changes after uniformization, due to the self-quenching nature of the charge injection. Therefore, spatial charge replica 354 also undergoes line-by-line uniformization yielding line-by-line charge redistribution in accordance with the sweep of elongate scanner 310.

Line-by-line charge redistribution of spatial charge replica 354 causes measurable currents, associated with each new line of the X-ray image being read, in each electrode 221 (FIG. 8) of conductive electrode array 332. These flowing currents are sensed and read out by integrated data readout electronics 304 to provide an electrical signal representation of the transmission modulated X-ray imaging radiation 350 (FIG. 11B). It is appreciated that reading is carried out, raster line by raster line, with the data from each pixel of the raster line being read preferably represented by the current flowing to/from a corresponding electrode 221 (FIG. 8). Since readout from all electrodes 221 (FIG. 8) is carried out in parallel, a frame of data including an entire image can be read out in seconds.

Reading may be better understood by referring briefly to the equivalent circuit of FIG. 12. During reading, switch 347 is connected, representing charge injection activation. The charge injection causes capacitor CP to be charged to the value VB=VR. Charging current is measured by charge amplifier 344.

Referring back to FIG. 11C, the current flowing due to charge redistribution in each electrode 221 (FIG. 8) of conductive electrode array 332 is generally composed of two components. The first component is the injection current, which is associated with charge injection into the top surface of X-ray sensor 302. The second component is the induction current, which is associated with capacitive charge induction caused by the sweep of the biased electrostatic barrier 340 of elongate scanner 310 over the net charge pattern 352 of X-ray sensor 302. It is a particular feature of the present invention that the structure and materials associated with elongate scanner 310, most specifically as related to elongate electrostatic barrier 340, described hereinabove with reference to FIG. 4 are chosen so as to generally minimize the induction current so as to render it negligible. Alternatively, when the structure of the elongate scanner causes a greater induction current, hardware-based mechanism and software based method as described in applicant's previous filed U.S. patent application Ser. No. 09/233,327 filed Jan. 20, 1999 can be used to factor out the induction current during image readout.

The dimensions of each pixel, and thereby the readout spatial resolution, are determined in the following manner:

In the transverse direction (y-direction), the pixel size is adjustable in accordance with integrated radiation data readout electronics 304, with the minimum pixel size determined by the pitch of conductive electrode 221 (FIG. 8) in conductive electrode array 332.

In the x-direction, the pixel size, and thus the width of a raster line being read, is adjustable by the time elapsed between subsequent charge samplings, with the minimum pixel size determined by the spatial charge injection profile tailored by electrostatic barrier 340.

Typically, readout spatial resolutions of approximately 2–10 line pairs/millimeter can be achieved in both the x- and y-directions.

Preferably, all raster lines comprising an X-ray image are read out during a single sweep of elongate scanner 310. Following the sweep, the ASV of X-ray sensor 302 is typically becoming uniform and equal to the readout bias voltage value VR. Preferably, the value of VR is determined using feedback from ASV sensor 306 to set a value for VR prior to the readout sweep which provides automatic tone scale remapping of the integrated radiation data read out from X-ray sensor 302 as described hereinbelow. Alternatively, when automatic tone scale remapping is unnecessary, readout bias voltage VR may be set to be equal to the sensitizing voltage VS. In this case, sensitizing X-ray sensor 302 is achieved as a byproduct of image readout.

It is appreciated that when external optical radiation from an elongate light source 342 of elongate scanner 310 is employed prior to X-ray exposure in order to illuminate photoconductive layer 124 (FIG. 3) of photoelectric conversion multilayer 334, charge occupation of trap states thereacross occurs as described hereinabove. Occupying the trap states across photoconductive layer 124 (FIG. 3) of photoelectric conversion multilayer 334 by optical radiation illumination generally prevents the trapping of transiting charge carriers photogenerated in response to X-ray radiation or optical radiation emitted by scintillator 110 (FIG. 3). Since trapping of charge carriers representing image information is thus avoided, imagewise de-trapping during subsequent imaging cycles is avoided. Instead, de-trapping occurs generally uniformly throughout photoconductive layer 124 (FIG. 3) of photoelectric conversion multilayer 334 reducing ghosting problems at the expense of an increase in the dark current.

It is a particular feature of the present invention that increased dark current can be compensated for by factoring out a DC component and providing an automatic tone scale remapping of the image being read out as described hereinbelow. Therefore employing optical radiation illumination to occupy trap states in photoconductive layer 124 (FIG. 3) of photoelectric conversion layer 334 is suitable for reducing ghosting effects in accordance with the present invention.

Reference is now made to FIG. 11D which illustrates effective neutralization of the ASV of X-ray sensor 302. Neutralizing may be carried out as part of a standard imaging cycle or alternatively may be carried out periodically such as prior to a period when the image detection module 300 is expected to remain idle, thereby reducing the electrical stress across photoelectric conversion multilayer 334 during non-use.

The ASV of X-ray sensor 302 is typically neutralized by activating charge injector 338 of elongate scanner 310, applying a neutralizing bias voltage VN thereto and sweeping elongate scanner 310 across image detection module 300. VN is typically in the range of between about 0 volts down to minus several hundred volts. Following sweeping, the ASV of X-ray sensor 302 is neutralized or effectively reduced to a generally very low value relative to GND, resulting in neutralization of charge retained at the top surface of X-ray sensor 302.

Charge neutralization by charge injector 338 of elongate scanner 310 may be concurrent with the irradiation of X-ray sensor 302 by elongate light source 342 of elongate scanner 310.

Figure 13:
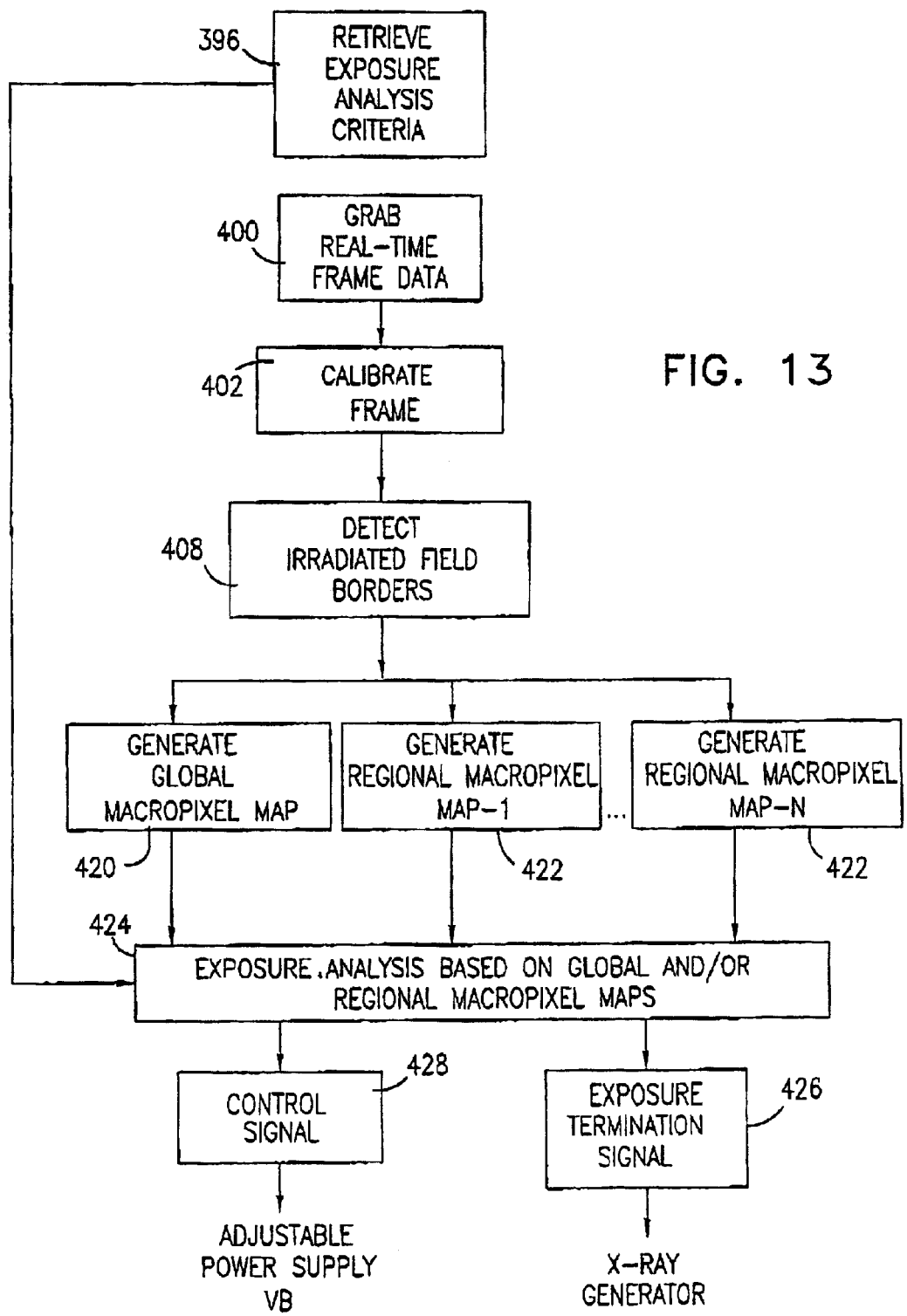
FIG. 13 is a block diagram showing the steps of detection of irradiated field borders in accordance with a preferred embodiment of the present invention.

Reference is now made to FIG. 13 which is a block diagram illustrating the steps of an algorithm for processing imagewise real-time exposure data from real-time radiation data electronics 308 (FIG. 11B) to provide an automatic exposure control for optimizing the X-ray dose and to set a bias value VR in accordance with a preferred embodiment of the present invention. The bias VR value, set prior to readout of integrated radiation data, as described hereinabove factors out a DC component, associated with the Fourier spectrum of spatial frequencies composing an X-ray image and which does not contribute imaging information, thus providing an automatic tone scale remapping function for an X-ray image being read. The DC component may be associated with a spatially non-modulated exposure component and with the dark decay of the photoelectric conversion layer multi 104 (FIG. 3).

It is appreciated that the algorithm described herein is executed during X-ray exposure by the real-time section of the data processor residing in system host computer 34 (FIG. 1). Exposure analysis criteria associated with the various types of examinations that are typically carried out in general radiography are stored in an examination library database in system host computer 34 (FIG. 1) and may be periodically updated.

Before exposure, exposure analysis criteria associated with the specific examination to be carried out are preferably retrieved from the examination library database as indicated by block 396. The exposure analysis criteria retrieved from the examination library database correspond to the type of examination to be carried out and details thereof such as anatomic region, patient build, etc.

During exposure, frame-by-frame grabbing of real-time exposure data occurs as indicated by block 400. Each frame preferably comprises the real-time exposure data, readout in the form of charges, from all plate electrodes 274 (FIG. 10) of the image detection module 30 (FIG. 1). Each plate electrode 274 (FIG. 10) is considered as one macropixel comprising one data element of the frame being grabbed.

As indicated in block 402, grabbed data is calibrated to compensate for offsets and gain variations in a manner known in the art. Frames of grabbed data, emerging in real-time during exposure, are used for detection of irradiated field borders as indicated in block 408.

The irradiated field is typically a rectangular area of the image detection module 30 (FIG. 1) upon which primary X-ray radiation, modulated by the object to be imaged, directly impinges. The borders of the irradiated field are adjustable and are typically defined by collimator 24 (FIG. 1) in accordance with the region of interest which is being imaged such that the irradiated field contains the entire region of interest. In addition, the irradiated field may include background regions which receive maximum exposure that are typically background regions upon which non-attenuated X-ray impinged (no object).

It is appreciated that secondary X-ray radiation, produced by radiation scatter from the object being imaged is not limited by the collimator. Radiation scatter which may be reduced using the anti-scatter grid 32 (FIG. 1), typically impinges upon the image detection module 30 (FIG. 1) within and beyond the borders of the irradiated field. As a result of this scatter, the minimum exposure value inside the irradiated field corresponding to the object's maximum attenuation may in some cases be lower than the exposure values outside of the irradiated field borders.

The border detection approach described in accordance with the as present invention is based upon detection of the maximum exposure value along each row and each column of macropixels or plate electrodes 274 (FIG. 10) of image detection module 30 (FIG. 1). Rows and columns of macropixels or plate electrodes 274 (FIG. 10) which do not traverse the irradiated field have significantly lower maximum exposure values than rows and columns which do traverse the irradiated field.

Figure 14:
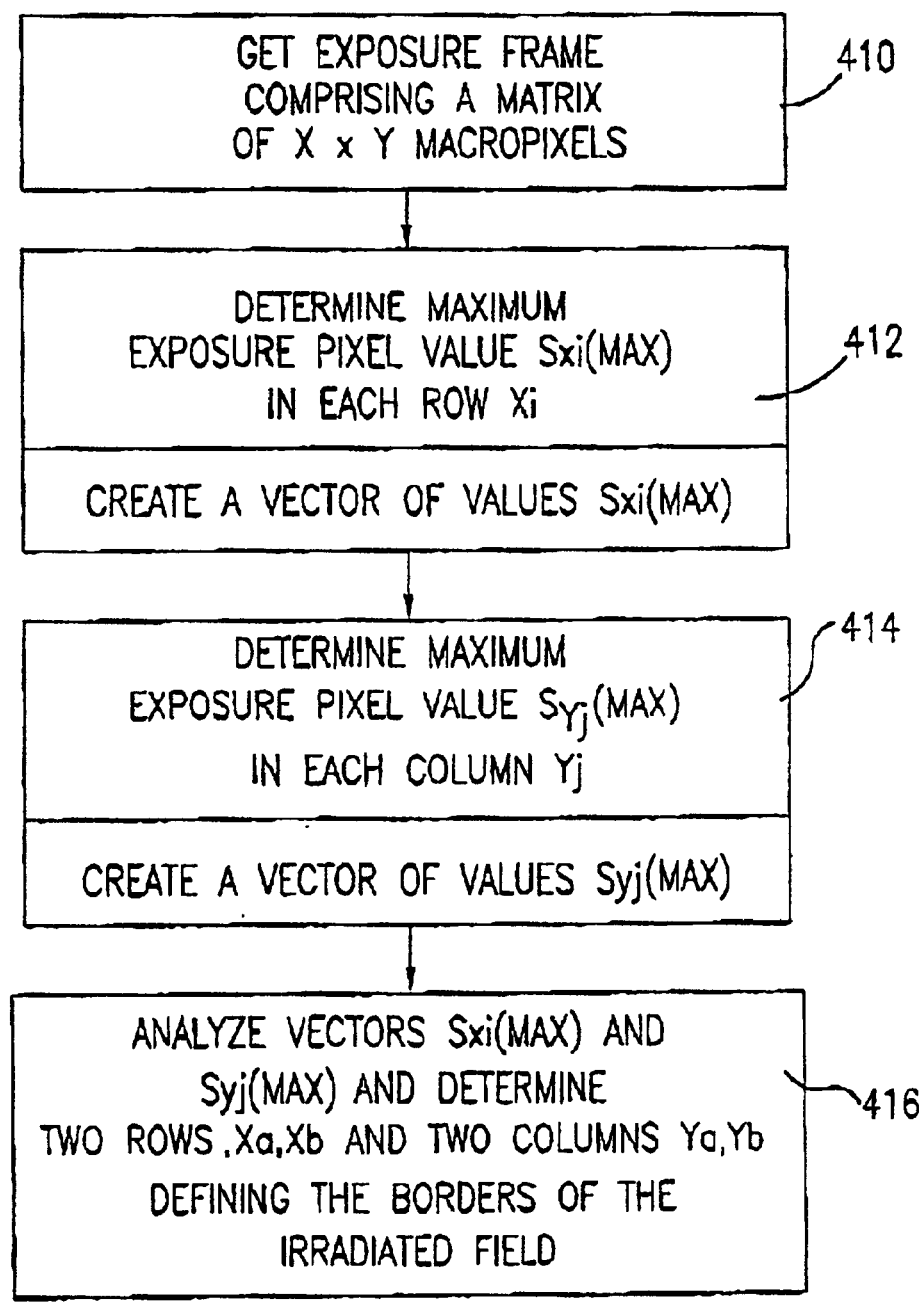
FIG. 14 is a graphical illustration useful in understanding the border detection steps in accordance with a preferred embodiment of the present invention

The detection of irradiated field borders shown in block 408 may be understood by additional reference to FIG. 14 which describes in detail the steps of detection of irradiated field borders in accordance with a preferred embodiment of the present invention.

As seen in FIG. 14, a frame of real-time exposure data, preferably grabbed in the form of a macropixel matrix having X rows and Y columns as described hereinabove, is loaded as indicated in block 410. Following loading, the exposure value from each macropixel of each row i is evaluated to determine the maximum exposure value $S_{Xi}$ (MAX for the row i. The maximum exposure values of all rows are calculated to create a vector comprising the $S_{Xi}$ (MAX values for all rows of macropixels as indicated by block 412.

Following evaluation, the exposure value of each macropixel of each column j of macropixels is evaluated to determine the maximum exposure value $S_{Yj}$(MAX) for the column j. The maximum exposure values of all columns are calculated to create a vector comprising the $S_{Yj}$(MAX) values for all columns of macropixels as indicated by block 414.

Each vector $S_{Xi}$(MAX) and $S_{Yj}$(MAX) is analyzed according to a threshold discrimination criterion, element by element, from the first vector element to the last element and from its last element to its first element in order to determine the two rows Xa and Xb and two columns Ya and Yb at which the predefined threshold is crossed, thereby defining borders of the irradiated field as indicated by block 416. It is appreciated that each border defining the irradiated field is typically determined with a positional accuracy of +/− one macropixel corresponding to the dimension of one plate electrode 274 (FIG. 10).

Various approaches to determining the threshold discrimination criterion can be implemented such as using the vector maximum value or averaged maximum peak values to provide a dose normalized threshold. Alternatively, other methods for determining the irradiated field during exposure may be implemented.

In the illustration of FIG. 10 a global cluster of macropixels (or plate electrodes 274) making up the irradiated field is indicated by reference numeral 294. Reference numerals 296 indicate regional clusters of macropixels within the borders of the irradiated field as described. It is appreciated that global cluster 294 is typically used for histogram analysis and that the regional clusters 296 are typically used for density analysis as described hereinbelow.

Referring back to FIG. 13, the step following determination of the irradiated field borders is the creation of a global macropixel map as indicated by block 420 and regional macropixel maps as indicated by blocks 422.

The global macropixel map contains the exposure tone values of all macropixels within global cluster 294 (FIG. 10), while the regional macropixel maps contain the exposure tone values of regional clusters 296 (FIG. 10).

The locations of regional clusters 296 (FIG. 10) may be fixed with respect to the image detection module 30 (FIG. 1). Alternatively or additionally, the locations of regional clusters 296 (FIG. 10) may be adjustable with respect to the origin of the irradiated field 294.

The macropixels selected to form a regional cluster 294 (FIG. 10) may be determined in accordance with the exposure analysis criteria according to the type of examination to be carried out, as shown in block 396. Thus, each examination type may be associated with a unique regional cluster scheme which provides higher accuracy of exposure sensing for that specific examination.

During exposure, the global and/or one or more of the regional macropixel maps are comparatively analyzed as indicated by block 424 with respect to exposure analysis criteria retrieved from the examination library in accordance with the examination to be carried out as indicated by block 396. For example, the analysis may be based upon histogram comparison as known in the art to provide an exposure duration at which the image contrast in the region of interest reaches an acceptable value for diagnostic purposes. When the desired contrast level is reached, exposure is preferably terminated by sending an exposure termination signal to X-ray generator 40 (FIG. 1) as indicated by block 426. Alternatively, when exposure parameters are input to the console (not shown) of X-ray generator 40 (FIG. 1), the exposure termination signal does not control the X-ray generator 40 (FIG. 1) and termination is carried out in a conventional manner not based on the exposure termination signal.

The duration of the actual exposure, which is typically shorter than the maximum expected exposure time discussed hereinabove is controlled by the output of the algorithm, thus providing dose control also known as automatic exposure control. It is appreciated that in no event will the duration of actual exposure be allowed to exceed the maximum expected exposure time in order to ensure safe operation of the imaging system.

In accordance with a preferred embodiment of the present invention, imagewise exposure data is available in real time and thus suitable known methods for real-time image analysis to determine image contrast of the global macropixel map and/or density levels of the regional macropixel maps may be implemented in a preferred embodiment of the present invention and used for automatic exposure control.

In addition to exposure control, a histogram of the global macropixel map may be analyzed, as known in the art, to determine an averaged exposure level within the irradiated field at the end of the exposure. The average exposure level, at the end of the X-ray exposure, is used to control and set the bias voltage VB (FIG. 7) as indicated by block 428 to the value VR which is desirable for readout of integrated radiation data. Determining the value VR using feedback from the ASV sensor 270 (FIG. 10) allows a DC component to be factored out from the integrated radiation data of the X-ray image. The DC component is associated with a component of the spatial Fourier frequencies composing an X-ray image being read which does not contribute any imaging information but does consume dynamic range. Factoring out the DC component thus effectively expands the dynamic range of integrated radiation readout electronics 223 (FIG. 8) and provides an automatic tone scale remapping function for the X-ray image being read out.

When a value for VR is selected as described above to provide tone scale remapping, the number of bits per pixel employed for the A/D converters 226 (FIG. 8) may be reduced from 12–14 bits to 8 bits, without losing any significant image information. This reduction simplifies and reduces the cost of integrated data readout electronics.

It will be appreciated by persons skilled in the art that the present invention is not limited by what has been described above. The scope of the present invention includes both combinations and sub-combinations of the various features described hereinabove as well as modifications and additions thereto which would occur to a person skilled in the art upon reading the foregoing disclosure and which are not in the prior art.

What is claimed is:

1. Ionizing radiation imaging apparatus including:
   a scintillator element which emits optical radiation as a result of absorption of ionizing radiation; and
   a photoconductive multilayer element optically coupled to said scintillator element, said photoconductive multilayer element including:
   a charge generation layer which is sensitive to the optical radiation emitted by said scintillator element; and
   a charge transport layer disposed over said charge generation layer, said charge transport layer being operative to retain a charge pattern corresponding to said ionizing radiation.

2. Ionizing radiation imaging apparatus according to claim 1 and also including a conductive layer, forming a plurality of elongate electrodes, disposed intermediate said scintillator element and said photoconductive multilayer element.

3. Ionizing radiation imaging apparatus according to claim 2 and also including readout electronics coupled to said plurality of elongate electrodes.

4. Ionizing radiation imaging apparatus according to claim 2 and also including an optically transparent blocking layer disposed intermediate said photoconductive multilayer element and said conductive layer, wherein said optically transparent blocking layer is operative to block charges of at least one polarity from being injected into said photoconductive multilayer element from said conductive layer.

5. Ionizing radiation sensitive apparatus according to claim 1 and wherein said charge transport layer is also operative to convert ionizing radiation to charge carriers.

6. Ionizing radiation sensitive apparatus according to claim 1 and wherein said photoconductive multilayer element also includes an optical radiation blocking layer overlying said charge transport layer.

7. Ionizing radiation sensitive apparatus according to claim 6 and wherein said optical radiation blocking layer is formed of amorphous alkali-doped selenium.

8. Ionizing radiation sensitive apparatus according to claim 1 and wherein said scintillator element is formed on a generally optically reflecting substrate.

9. Ionizing radiation sensitive apparatus according to claim 1 and wherein said scintillator element is formed on a generally optically absorbing substrate.

10. Ionizing radiation sensitive apparatus according to claim 1 and wherein said scintillator element includes cesium iodide doped with thallium.

11. Ionizing radiation sensitive apparatus according to claim 1 and wherein said charge generation layer is formed of arsenic triselenide.

12. Ionizing radiation sensitive apparatus according to claim 1 and wherein said charge generation layer is formed of a selenium-tellerium-arsenic alloy.

13. Ionizing radiation sensitive apparatus according to claim 1 and wherein said charge transport layer is formed of amorphous selenium doped with either arsenic or chlorine or a combination thereof.

14. Ionizing radiation sensitive apparatus according to claim 1 and wherein said charge transport layer is formed of an organic material.

15. Ionizing radiation sensitive apparatus according to claim 1 and wherein said scintillator element includes a planarization layer.

16. Ionizing radiation sensitive apparatus according to claim 1 and wherein said ionizing radiation is X-ray radiation.

17. An ionizing radiation imaging sensor including:
   a first conversion element that is operative to convert imaging ionizing radiation to optical radiation;
   a second conversion element that is operative to convert said optical radiation to a charge pattern corresponding to said imaging ionizing radiation;
   a charge source operative at generally atmospheric pressure to provide non-contact charge injection onto said second conversion element thus causing said charge pattern to be sensed.

18. An ionizing radiation imaging sensor according to claim 17 above wherein said second conversion element is further operative to directly convert ionizing radiation to electrical charges.

19. An ionizing radiation imaging sensor according to claim 17 and wherein said ionizing radiation is X-ray radiation.

20. An ionizing radiation image sensor comprising:

a photoelectric conversion element having first and second opposing surfaces, wherein said photoelectric conversion element is highly photogeneration-sensitive to optical radiation impinging upon said first surface and relatively photogeneration-insensitive to optical radiation impinging upon said second surface; and an ionizing radiation sensitive scintillator element optically coupled to said first surface of said photoelectric conversion element.

21. An ionizing radiation image sensor according to claim 20 wherein said second surface of said photoelectric conversion element is highly permeable to ionizing radiation.

22. An ionizing radiation image sensor according to claim 20 wherein said second surface of said photoelectric conversion element is an exposed charge accepting and retaining surface.

23. An ionizing radiation image sensor according to claim 20 wherein said photoelectric conversion element is amorphous selenium based.

24. A charge pattern produced in response to absorption of spatially modulated ionizing radiation and composed of:

charge carriers generated in response to partial absorption of said ionizing radiation; and charge carriers generated in response to non-ionizing optical radiation emitted in response to further absorption of said ionizing radiation.

25. A charge pattern in accordance with claim 24 and wherein said optical radiation is emitted concurrently with the absorption of said ionizing radiation.

26. A charge pattern in accordance with claim 25 and wherein said optical radiation is emitted through external stimulation subsequent to the absorption of said ionizing radiation.

27. A charge pattern in accordance with claim 24 and wherein said ionizing radiation is X-ray radiation.

28. A method for sensing X-ray images and including:

exposing a sensor to spatially modulated X-ray radiation; and forming a net charge pattern retained by the sensor, said net charge pattern representing said spatially modulated radiation and being composed of charge carriers generated in response to partial absorption of said spatially modulated X-ray radiation and charge carriers generated in response to optical radiation emitted within the sensor in response to further absorption of said spatially modulated X-ray radiation.

29. A method for detecting X-ray images including:

exposing an imaging sensor to ionizing radiation;

emitting optical radiation in a scintillator element of said imaging sensor in response to absorption of said ionizing radiation;

photogenerating charge in a charge generation layer of said imaging sensor in response to said optical radiation;

providing transport of said photogenerated charge through a charge transport layer of said imaging sensor thereby creating a net charge pattern at said imaging sensor wherein said net charge pattern generally corresponds to said ionizing radiation;

injecting charge onto said sensor to uniformize said net charge pattern thus yielding measurable charge flow within said sensor; and detecting said measurable charge flow to provide a digital image representation of said X-ray images.

30. A method for detecting ionizing radiation images including:

providing an imaging sensor;

causing ionizing radiation to impinge on said imaging sensor;

converting said ionizing radiation to optical radiation in said imaging sensor;

converting said optical radiation to a charge pattern at said imaging sensor wherein said charge pattern corresponds to said ionizing radiation; and providing non-contact injection of charge at generally atmospheric pressure onto said imaging sensor, thus causing said charge pattern to be detected.

31. A method for creating a charge pattern in an imaging sensor in response to ionizing radiation including:

exposing said imaging sensor to ionizing radiation;

emitting optical radiation in a scintillator element of said imaging sensor in response to absorption of said ionizing radiation;

photogenerating charge in a charge generation layer of said imaging sensor in response to said optical radiation; and providing transport of said charge through a charge transport layer of said imaging sensor therefore creating a net charge pattern at said imaging sensor wherein said net charge pattern generally corresponds to said ionizing radiation.

32. A method for detecting ionizing radiation images including:

exposing said imaging sensor to ionizing radiation;

emitting optical radiation in a scintillator element of said imaging sensor in response to absorption of said ionizing radiation;

photogenerating charge in a charge generation layer of said imaging sensor in response to said optical radiation;

providing transport of said charge through a charge transport layer of said imaging sensor thereby creating a net charge pattern at said imaging sensor wherein said net charge pattern generally corresponds to said ionizing radiation;

uniformizing said charge pattern through injection of charge of either or both polarities into said imaging sensor thus causing currents to flow within said imaging sensor; and reading out said currents from said imaging sensor to provide a digital image representation corresponding to said charge pattern.

33. A method for detecting ionizing radiation images according to claim 32 and wherein said ionizing radiation is X-ray radiation.

* * * * *